(12) United States Patent
Pereira

(10) Patent No.: US 7,035,968 B1
(45) Date of Patent: Apr. 25, 2006

(54) CONTENT ADDRESSABLE MEMORY WITH RANGE COMPARE FUNCTION

(75) Inventor: Jose P. Pereira, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 360 days.

(21) Appl. No.: 09/963,334

(22) Filed: Sep. 24, 2001

(51) Int. Cl.
  *G06F 12/00* (2006.01)

(52) U.S. Cl. .................. 711/108; 711/158; 711/202; 707/6

(58) Field of Classification Search .............. 711/108, 711/158, 202; 707/6
See application file for complete search history.

(56) References Cited

U.S. PATENT DOCUMENTS

| | | |
|---|---|---|
| 3,264,616 A | 8/1966 | Lindquist |
| 3,350,698 A | 10/1967 | Prichard, Jr. |
| 3,389,377 A | 6/1968 | Cole |
| 4,996,666 A | 2/1991 | Duluk, Jr. |
| 5,444,649 A | 8/1995 | Nemirovsky |
| 5,561,429 A * | 10/1996 | Halberstam et al. .......... 342/14 |
| 5,841,679 A * | 11/1998 | Miura et al. ................ 708/207 |
| 6,049,876 A * | 4/2000 | Moughanni et al. ........ 713/200 |
| 6,108,227 A * | 8/2000 | Voelkel ....................... 365/49 |
| 6,289,414 B1 * | 9/2001 | Feldmeier et al. .......... 711/108 |
| 6,377,577 B1 * | 4/2002 | Bechtolsheim et al. ..... 370/392 |
| 6,389,507 B1 * | 5/2002 | Sherman ..................... 711/108 |
| 6,483,732 B1 * | 11/2002 | Gray ........................... 365/49 |
| 6,633,953 B1 * | 10/2003 | Stark .......................... 711/108 |
| 2002/0007446 A1 | 1/2002 | Stark |

FOREIGN PATENT DOCUMENTS

| | | |
|---|---|---|
| WO | WO 99/23663 | 5/1999 |
| WO | WO-02/043069 A2 | 5/2002 |

* cited by examiner

*Primary Examiner*—Donald Sparks
*Assistant Examiner*—Ngoc V Dinh
(74) *Attorney, Agent, or Firm*—Shemwell Gregory & Courtney LLP

(57) ABSTRACT

A content addressable memory (CAM) device having a range compare function. A boundary value is stored within a plurality of CAM cells within the CAM device. A range compare operation is performed to determine whether a comparand is greater than the boundary value. A result signal is asserted if the comparand is greater than the boundary value.

81 Claims, 13 Drawing Sheets

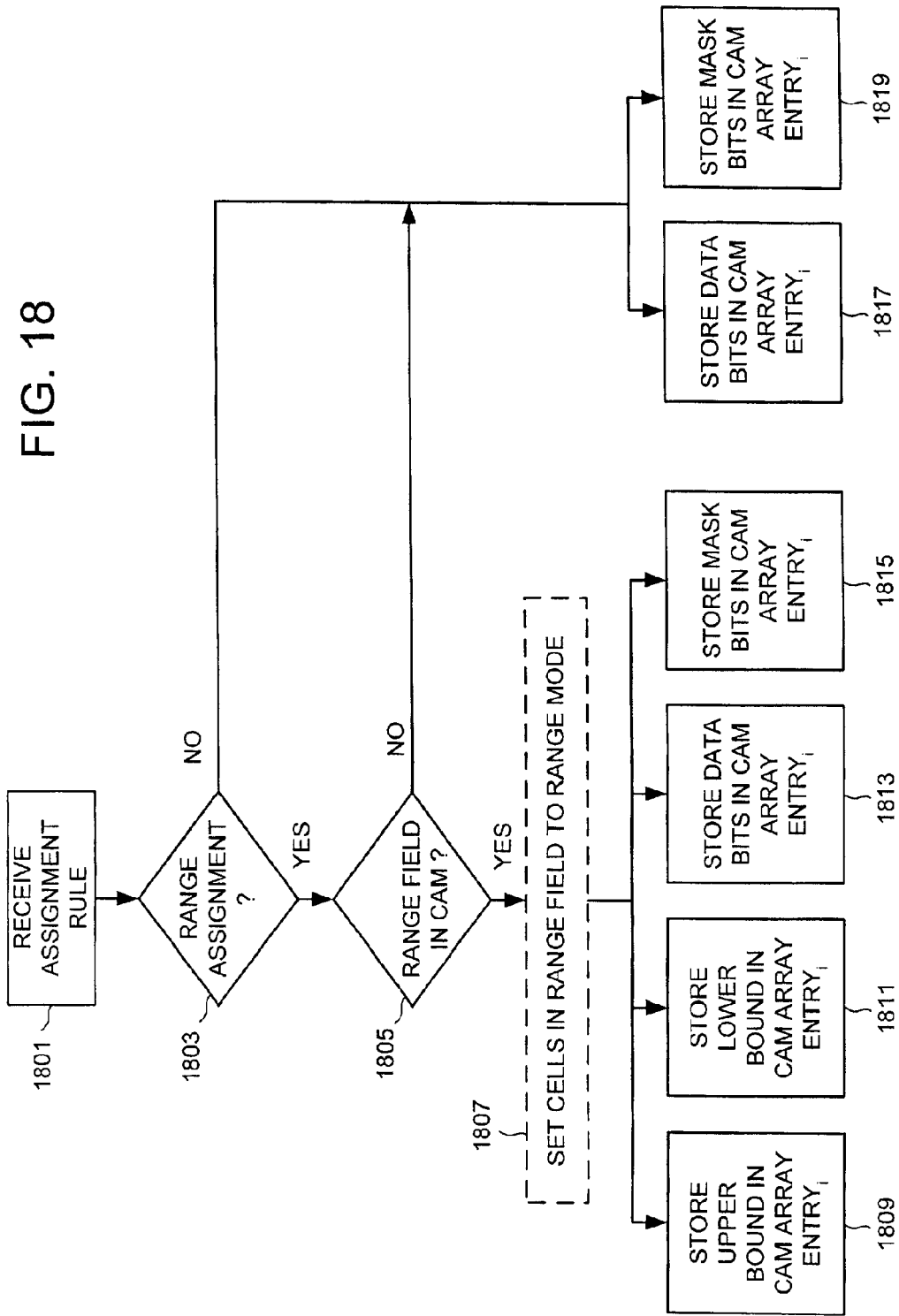

CONTENT ADDRESSABLE MEMORY WITH RANGE COMPARE FUNCTION

FIELD OF THE INVENTION

The present invention relates generally to content addressable memory devices, and more particularly to comparison operations within content addressable memory devices.

BACKGROUND

Content addressable memory (CAM) devices are often used to perform packet forwarding and classification operations in network switches and routers. A CAM device can be instructed to compare a comparand value, typically formed from one or more fields within the header of an incoming packet, with CAM words stored in an associative storage array within the CAM device. If the comparand matches a CAM word, the CAM device generates a CAM index that identifies the location of the matching CAM word within the storage array, and asserts a match flag to signal the match. The CAM index may then be used to index another storage array, either within or separate from the CAM device, to retrieve routing or classification information for the packet.

Compare operations within a CAM device are typically carried out on a bit-by-bit basis to determine if the comparand is identical to a CAM word. In some cases, selected bits within the comparand or the CAM word may be masked, enabling a range of comparands to match the CAM word. Unfortunately, the range of matching comparands achieved by masking is restricted in significant ways. First, the total range of matching comparands is limited to a power of two value (i.e., the inclusive difference between the highest and lowest matching comparands is $2^N$ where N is the number of contiguous masked bits). A second restriction of a mask-based range is that the lower limit of the range generally must be an integral multiple of the total range (i.e., lower limit=$0\times2^N$, $1\times2^N$, $2\times2^N$, ...). If a match is desired for a range of comparands that is not a power of two or for which the lower limit is not an integral multiple of the total range, then multiple compare operations typically must be performed, each compare operation covering a portion of the overall range and meeting the above mask-based range restrictions. Referring to FIG. 1, for example, to determine whether a given comparand has an eight-bit source port field within the range 23 to 46, six different compare operations are needed (i.e., comparisons against values 23 and 46, and against mask-based ranges 31–24, 39–32, 43–40, and 45–44 as shown in FIG. 1). Similarly, six different compare operations are needed to determine whether a sixteen-bit destination port field within a comparand exceeds 1023 (i.e., comparisons against mask-based ranges 2047–1024, 4095–2048, 8191–4096, 16383–8192, 32767–16384, and 65535–32768 as shown in FIG. 1).

The multiple compare operations used to compare a comparand against a range of values may be performed successively, for example using different global mask values to define the different mask-based ranges, or they may be performed simultaneously by comparing a comparand to multiple CAM words in the CAM array, each CAM word constituting a range component that covers a portion of the overall range. Simultaneous comparison against multiple range components (i.e., single-cycle range compare) is faster than performing successive compare operations, but consumes a relatively large amount of CAM array storage. In the case of a binary CAM device, for example, each value in a given range must typically be stored in the CAM array to enable a single-cycle range compare. For instance, to permit the source port to range from 23 to 46 as shown in FIG. 1, 24 range components (i.e., 24 CAM words) would need to be stored in the CAM array. Alternatively, in the case of a ternary CAM device (i.e., a CAM device that includes storage for local mask values to permit per-row masking of CAM words), single-cycle range compare may be enabled by storing one range component in the CAM array for each mask-based range (setting the local mask value for the entry to define the mask-based range) and one range component for each of the exact values in the range. Referring to FIG. 1, for example, six range components may be stored in a ternary CAM device to cover the source port range from 23 to 46: exact value 23; mask-based range 31–24; mask-based range 39–32; mask-based range 43–40; mask-based range 45–44, and exact value 46.

The consumption of CAM array storage due to storage of multiple range components becomes more severe if more than one field within a comparand is permitted to range. Typically, the total number of range components that must be stored is the product of the numbers of range components required to define each distinct range. Referring to FIG. 1, for example, if a match is desired on any comparand for which the source port is between 23 to 46 (a range defined by 6 range components) and for which the destination port is greater than 1023 (a range also defined by 6 range components), then a total of 36 range components (i.e., 6×6) must be stored in a typical ternary CAM array to fully define the range of comparands which will match the source port and destination port ranges. The number of range components proliferates as other fields within the comparand are permitted to range (e.g., fields such as the source address, destination address, protocol, type of service, and virtual private network, etc.), consuming further storage space within the CAM array.

SUMMARY

A content addressable memory (CAM) device having one or more ranging CAM cells is disclosed in numerous embodiments. In one embodiment, each ranging CAM cell includes a pair of storage elements to store an upper bound value and a lower bound value, respectively, and a compare circuit to compare a comparand value against the upper bound value and the lower bound value. The compare circuit outputs a greater-than signal if the comparand is above the upper bound and a less-than signal if the comparand is below the lower bound. By chaining a set of ranging CAM cells together such that each ranging CAM cell in the chain except the least significant is coupled to receive the greater-than/less-than signals from a less significant ranging CAM cell in the chain, the individual upper bound values and lower bound values are combined to define a desired range of matching comparands. The greater-than and less-than signals output by the most significant ranging CAM cell in the chain may then be coupled to a match line to signal an out-of-range condition if an incoming comparand is determined to be greater than or less than the search range.

In alternative embodiments, instead of providing a pair of storage elements within each ranging CAM cell to define a search range having an upper and lower bound, a single storage element may be used within each ranging CAM cell to define an upper or a lower bound. In such embodiments, a compare circuit is provided to compare a comparand value against the upper or lower bound to generate an output indicative of whether the bound is exceeded or not.

In yet other embodiments, multi-mode CAM cells within the CAM array may be selectively switched between a ranging mode of operation and either a binary or ternary mode of operation.

These and other features and advantages of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 18 illustrates the operation of the host processor of FIG. 17 according to one embodiment.

DETAILED DESCRIPTION

Ranging CAM Device

Figure 2:
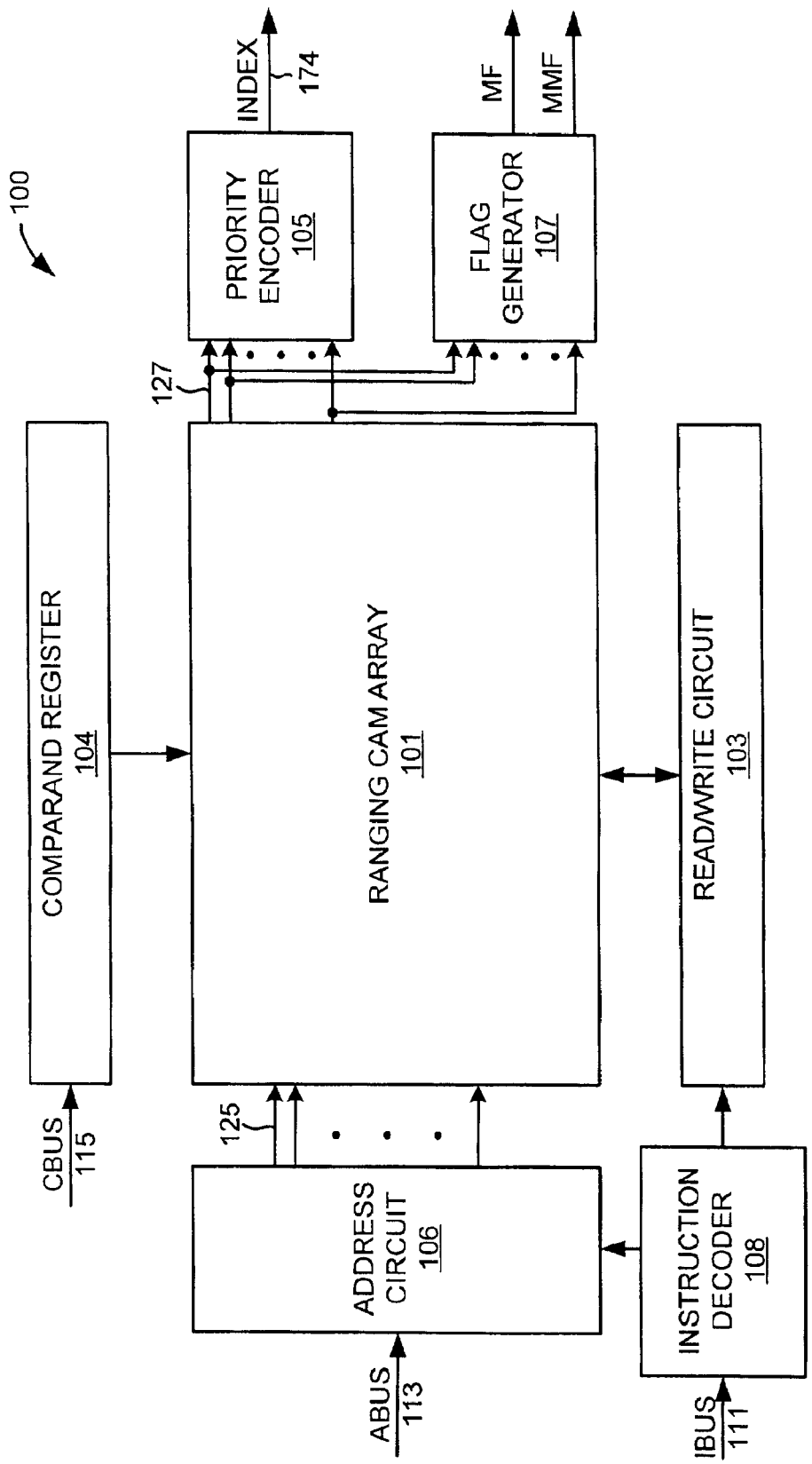
FIG. 2 illustrates a ranging CAM device according to an embodiment of the present invention.

FIG. 2 illustrates a ranging CAM device 100 according to an embodiment of the present invention. The ranging CAM device 100 includes a ranging CAM array 101, address circuit 106, instruction decoder 108, flag generator 107, priority encoder 105, comparand register 104 and read/write circuit 103. Instructions, addresses and commands are input to the CAM device 100 via an instruction bus 111, address bus 113 and comparand bus 115, respectively. Each of the buses is preferably a multi-conductor signal path coupled to at least one host device, such as a general purpose processor, digital signal processor, network processor, application specific integrated circuit (ASIC) or other instruction issuing device. Also, in alternative embodiments, one or more of the buses may be eliminated and the corresponding signals time-multiplexed onto another of the buses.

The ranging CAM array 101 is coupled to (i.e., connected directly to or through one or more intervening circuits) the address circuit 106, priority encoder 105, flag generator 107, comparand register 104, and read/write circuit 103. The address circuit 106 is used to select a particular row of the ranging CAM array for read or write access. The read/write circuit 103 is used to sense the output of the selected row during a read operation and to transmit a value to the selected row during a write operation. The comparand register 104 is used to store a comparand value received via the comparand bus 115, and outputs the comparand value to the CAM array 101. In alternative embodiments the comparand register 104 may be omitted and the comparand value input directly to the ranging CAM array 101 from the comparand bus 115.

The ranging CAM array 101 includes a plurality of CAM cells, some or all of which may be ranging CAM cells according to embodiments described below. Each row of CAM cells is used to store one or more data words referred to herein as CAM words. Each row of CAM cells may additionally include storage for a validity value that indicates whether a valid CAM word is stored within the row. In the case of segmented rows, discussed below, a separate validity value may be stored for each row segment.

During a compare operation, the comparand may be masked by a global mask value, then compared simultaneously with all the CAM words stored in the ranging CAM array 101. Each of the rows of CAM cells in the ranging CAM array 101 is coupled to a respective match line 127, and any match between the comparand and a valid CAM word results in a match signal being output to the priority encoder 105 and the flag generator 107 via the match line 127. When one or more match signals are asserted on the match lines 127, the priority encoder 105 selects one of the match signals and outputs a CAM index 174 (i.e., address of the CAM word corresponding to the selected match signal). The flag generator 107 also receives the match signals, and outputs a match flag signal (MF) to indicate that a match has occurred. If more than one match signal is asserted, the flag circuit may additionally output a multiple match flag signal (MMF) to indicate that multiple matches have occurred.

Each CAM word stored within the ranging CAM array 101 may include one or more exact values, bit-masked values, and/or range definitions. An exact value is a pattern of bits that represents a single numeric value. A bit-masked value is an exact value in which one or more bits are masked (e.g., by a local mask value in a ternary CAM cell), thereby specifying a power-of-two range. In the case of a compare operation, exact values and bit-masked values are similar in that both types of values are compared for equality with an incoming comparand. That is, a match between a comparand and an exact or bit-masked value occurs when the comparand is equal to the exact or bit-masked value bit-for-bit after any bit masking.

Range definitions are values that define bounded numeric ranges. In contrast to exact values and bit-masked values, the value (or values) that form a range definition are not compared for equality with an incoming comparand, but rather are used define the upper and lower bounds of an inequality expression. A comparand that falls within the bounded numeric range is deemed to match the range definition. Range definitions may be either explicit or implicit. An explicit range definition is a vector quantity that includes two component values, an upper bound value and a lower bound value. Together, the upper bound value and the lower bound value define a range of comparands that will be deemed to match the range definition. An explicit range definition may be inclusive or exclusive of the upper and lower bound values. In the case of an inclusive explicit range definition, a match is signaled if the following expression is true:

lower bound≦comparand≦upper bound.

In the case of exclusive explicit range definition, a match is signaled if the following expression is true:

lower bound<comparand<upper bound.

An implicit range definition includes only one bound value, upper or lower, with the other bound impliedly being the maximum or minimum value that can be numerically represented by the comparand value (or portion thereof). For example, in the case of a sixteen bit field within a CAM word (and corresponding comparand), an implicit range definition may include a lower bound value of 1024 to define a range between 1024 and 65535 (65535 being the maximum possible value for the sixteen-bit field). Any comparand value of 1024 or greater (i.e., up to 65535) falls within the bounded range defined by the threshold value and is said to "match" the implicit range definition. Like explicit range definitions, implicit range definitions can include or exclude the bound value.

Ranging CAM Array

Figure 3:
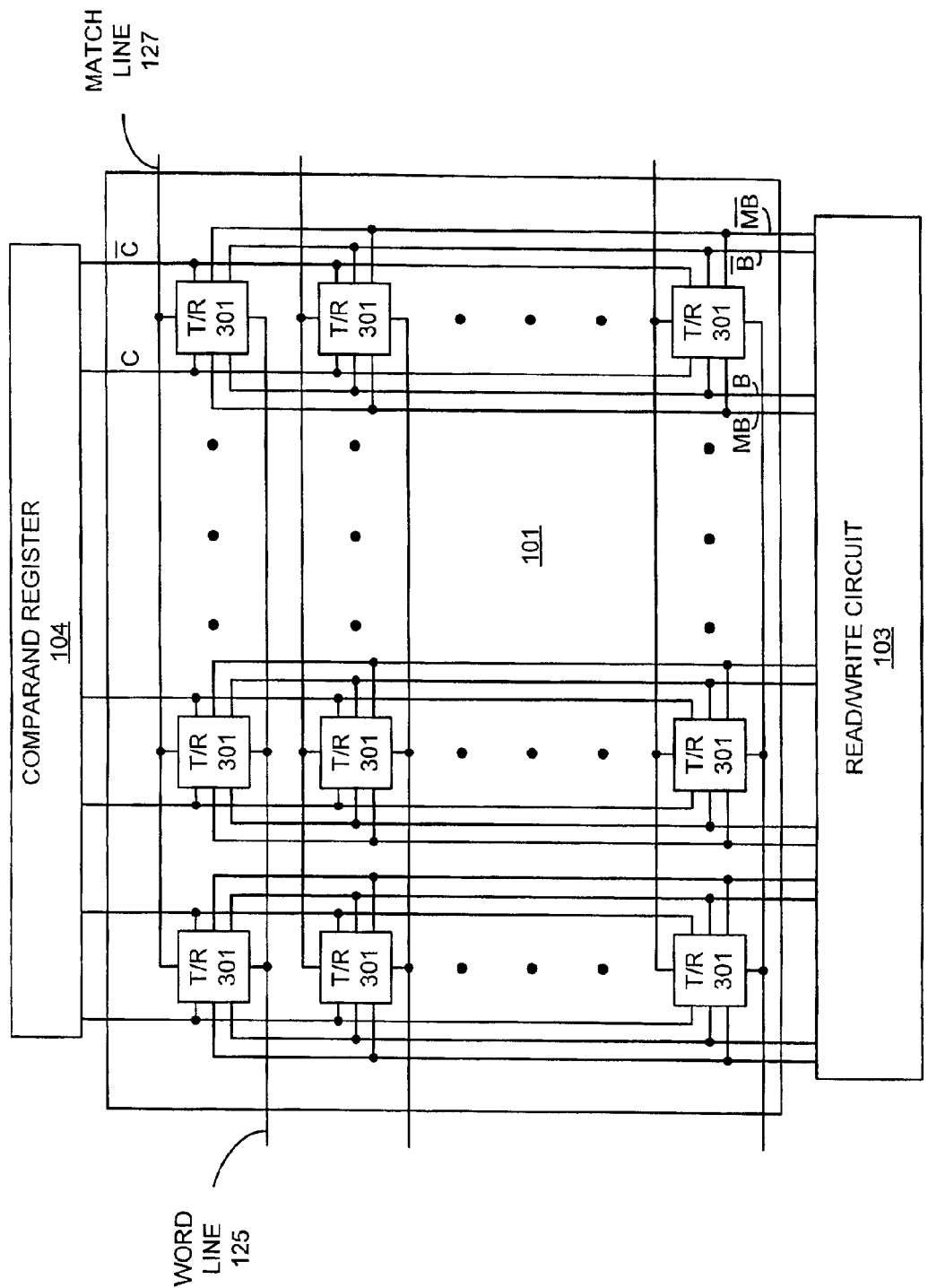
FIG. 3 illustrates an embodiment of a ranging CAM array and its connections to a comparand register and read/write circuit.

FIG. 3 illustrates an embodiment of the ranging CAM array 101 and its connections to the comparand register 104 and read/write circuit 103. As shown, the ranging CAM array 101 includes a plurality of CAM cells 301 arranged in rows and columns. Each of the CAM cells is designated "T/R" to indicate that it may be a ternary CAM cell, a ranging CAM cell, or a multi-mode CAM cell that may be selectively operated in either a ternary mode or a ranging mode. Each of the CAM cells may also be a binary CAM cell as discussed below. Each row of the CAM cells is coupled to a respective word line 125 and to a respective match line 127. Note that one or more additional word lines 125 may be provided to enable independent access to different sets of storage elements within CAM array 101. For example, a first word line may be activated to access (e.g., write or read) data storage elements within a row of ternary CAM cells, while a second word line may be activated at the same time or in a pipelined fashion to access mask storage elements within the same or a different row of ternary CAM cells. CAM array 101 may also include more than one match line 127 per row of CAM cells. For example, multiple compare circuits may be provided within all or a portion of the CAM cells 301 to enable pipelined or parallel compare operations, each compare circuit being coupled to a respective one of multiple match lines 127.

Each column of the CAM cells is coupled to the comparand register 104 via a pair of comparand signal lines (C and $\overline{C}$), and to the read/write circuit 103 via a first pair of bit lines (B and $\overline{B}$) and via a second pair of bit lines (MB and $\overline{MB}$). (One or more additional pairs of comparand lines may be provided per column of CAM cells to enable pipelined compare operations.) During a compare operation, each pair of comparand signal lines is used to provide a comparand signal (e.g., a bit from the comparand value stored in the comparand register 104) and its complement to each CAM cell 301 in the corresponding column such that the comparand is provided, bit-for-bit, to each column of CAM cells in the ranging CAM array 101. Each CAM cell within each row of CAM cells generates a compare result which is used to affect the logical state of the match line 127. Although each of the CAM cells 301 is depicted in FIG. 3 as being coupled to a corresponding match line, one or more ranging CAM cells may not be coupled to a match line 127 and may instead be coupled to output a compare result to another ranging CAM cell to form a chain of ranging CAM cells.

In one embodiment, each of the CAM cells 301 includes first and second storage elements that may be used to store, in the case of a ternary CAM cell, a data value and a local mask value, or, in the case of a ranging CAM cell, an upper bound value and a lower bound value. In the case of a multi-mode CAM cell, the first and second storage elements are used to store either data and mask or upper and lower bounds according to the mode of operation selected for the CAM cell. In alternative embodiments, each of the CAM cells may include only a single storage element as discussed below. During a read or write access to the CAM array 101, one of the word lines 125 is activated by an address circuit (e.g., element 106 of FIG. 1) to select one of the rows of CAM cells for read or write access. In a read operation, each CAM cell in the selected row is enabled to output the contents of the first storage element to the read/write circuit 103 via the first pair of bit lines (e.g., as a complimentary pair of signals) and to output the contents of the second storage element to the read/write circuit 103 via the second pair of bit lines. Conversely, during a write operation, each CAM cell in the selected row is enabled to store in the first storage element a value received from the read/write circuit 103 via the first pair of bit lines, and to store in the second storage element a value received from the read/write circuit 103 via the second pair of bit lines. Because distinct pairs of bit lines are provided to carry data to and from the first and second storage elements within each CAM cell of a selected row, the contents of both storage elements within the CAM cells of a selected row may be read or written simultaneously. Also, because dedicated pairs of comparand signal lines are provided to input a comparand value to the ranging CAM array 101, a compare operation may be performed simultaneously (or at least concurrently, that is, at least partly overlapping in time) with reading or writing a selected row of CAM cells. In alternative embodiments, only one pair of bit lines may be provided per column of CAM cells for time-multiplexed access (read or write) to the first and second storage elements within a given row of CAM cells. Similarly, the dedicated pairs of comparand signal lines may be omitted and the bit lines time multiplexed (i.e., between read/write and compare operations) to supply comparand values to the CAM array 101. In the embodiment of FIG. 3, the CAM cells 301 within each row are depicted as being coupled to the corresponding match line 127 in a wired OR combination (e.g., to force a precharged match fine to a particular logic level in the event of a mismatch). Alternatively, a NAND structure may be used to logically combine the match results serially before affecting the logic state of the match line 127. For example, pass gates having gate terminals coupled to the respective match outputs of the CAM cells 301 within a given row may be coupled in series with one another between a match line output and a reference voltage so that, if any of the CAM cells 301 outputs a mismatch signal, the corresponding pass gate will be switched to a non-conducting state to interrupt the connection between the match line and the reference voltage, thereby signaling the mismatch condition (e.g., by causing the match line output to float or be charged by a pull up or pull down connection). More generally, any logical structure may be used to generate a match (or mismatch) signal for a row of CAM cells without departing from the spirit and scope of the present invention.

Ranging CAM Cell

Figure 4:
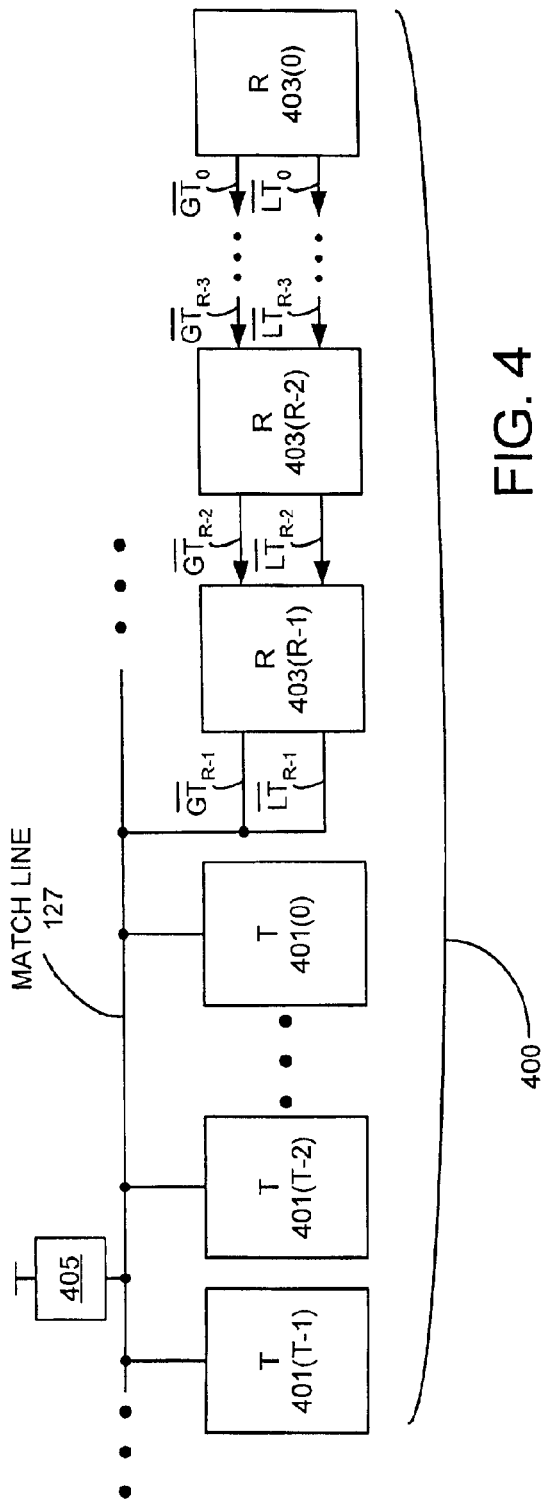
FIG. 4 illustrates an exemplary row of CAM cells coupled to a match line.

FIG. 4 illustrates an exemplary row of CAM cells 400 coupled to a match line 127. The row of CAM cells 400 includes a set of ternary CAM cells, 401 (T−1)–401(0), and a set of ranging CAM cells, 403(R−1)–403(0), T and R representing respective integer values that may range from one to any number. The ternary CAM cells 401(T−1)–401(0) may be used to store an exact value or a bit-masked value, and the ranging CAM cells 403(R−1)–403(0) may be used to store an explicit or implicit range definition. More or fewer sets of ternary CAM cells and more or fewer sets of ranging CAM cells may be included in the row 400 in alternative embodiments. Also, binary CAM cells may be used instead of or in addition to the ternary CAM cells 401 (T−1)–401(0).

The ranging CAM cells 403(R−1)–403(0) are coupled to one another in a chain that is ordered from a least significant ranging CAM cell 403(0) to a most significant ranging CAM cell 403(R−1). The most significant CAM cell 403(R−1) outputs a greater-than (GT) signal, $GT_{R-1}$, and a less-than (LT) signal, $LT_{R-1}$, on respective signal lines that are coupled in a wired-OR configuration to the match line 127. When asserted, the greater than signal, $GT_{R-1}$, indicates that a comparand value has been determined to be greater than an upper bound value stored within the row of CAM cells 400. Similarly, the less-than signal, $LT_{R-1}$, indicates that a comparand value has been determined to be less than a lower bound value stored within the row of CAM cells 400. Each of the less significant ranging CAM cells 403(R−2)–403(0)) is not directly connected to the match line, but rather is coupled to the match line through transistors in one or more of the more significant CAM cells and outputs a GT/LT signal pair to the next more significant ranging CAM cell in the chain. In one embodiment (i.e., an embodiment for storing an exclusive range definition), each ranging CAM cell 403 outputs an active low GT signal if either of the following conditions is met:

(CG1) a comparand value is greater than an upper bound value stored within the ranging CAM cell; or (CG2) the comparand value is equal to the upper bound value, and a GT signal from a next less significant ranging CAM cell is asserted (i.e., set to a low logic state).

Similarly, each ranging CAM cell 403 outputs an active low LT signal if either of the following conditions is met:

(CL1) the comparand value is less than a lower bound value stored within the ranging CAM cell; or (CL2) the comparand value is equal to the lower bound value, and a LT signal from a next less significant ranging CAM cell is asserted (i.e., set to a low logic state).

Note that neither the second condition for assertion of the GT signal nor the second condition for assertion of the LT signal will be met for the least significant ranging CAM cell 403(0) because there is no less significant ranging CAM cell to supply a GT or LT signal. As discussed below, the least significant ranging CAM cell 403(0) can be alternatively configured to effect storage of either an inclusive or exclusive range definition within the chain of ranging CAM cells 403(R−1)–403(0).

The GT and LT signals generated by a given ranging CAM cell 403 may be expressed analytically as follows:

$$\overline{GT_i} = (C_i > U_i) OR (C_i = U_i AND \overline{GT_{i-1}}); \text{ and}$$

$$\overline{LT_i} = (C_i < L_i) OR (C_i = L_i AND \overline{LT_{i-1}}),$$

where 'i' is an integer value indicating the position of the ranging CAM cell in the chain (0 to R−1), U is the upper bound, L is the lower bound and C is the comparand value. Note that the '¯' symbol is used in reference to GT and LT signals herein and in the accompanying figures to indicate that, in the exemplary embodiments shown, the GT and LT signals are active low signals. In alternative embodiments, the GT and LT signals and any other signals described herein may have active logic states opposite those shown.

Assuming that the comparand value received within each ranging CAM cell is a bit, and that the upper and lower bounds are also bits, the above expressions may be expressed in Boolean form as follows:

$$\overline{GT_i} = (C_i \cdot \overline{U_i}) + (C_i \cdot \overline{GT_{i-1}}) + (\overline{U_i} \cdot \overline{GT_{i-1}}); \text{ and}$$

$$\overline{LT_i} = (\overline{C_i} \cdot L_i) + (\overline{C_i} \cdot \overline{LT_{i-1}}) + (L_i \cdot \overline{LT_{i-1}}), \text{ where the '+' symbol indicates a logical OR operation and the '·' symbol indicates a logical AND operation.}$$

In the embodiment of FIG. 4, referred to herein as a wired-NOR embodiment, the match line is precharged to a high logical level by a pre-charge circuit 405. Any one or more of the ternary CAM cells 401(T−1)–401(0) may signal a mismatch by pulling the match line 127 to a low logic level. Similarly, the chain of ranging CAM cells may signal a mismatch (i.e., a comparand out of range condition) by outputting a logic low $GT_{R-1}$ signal or $LT_{R-1}$ signal to pull the match line 127 to a low logic level. In an alternative embodiment, match indications from the individual ternary CAM cells 401(T−1)–401(0) may be combined with one another and with a match indication from the chain of ranging CAM cells 403(R−1)–403(0) in a logical AND arrangement such that, if each of the ternary CAM cells 401 indicates a match, and if the chain of ranging CAM cells 403 indicates a match, a match signal will be asserted (either active high or active low) for the CAM row or segment thereof.

Figure 5:
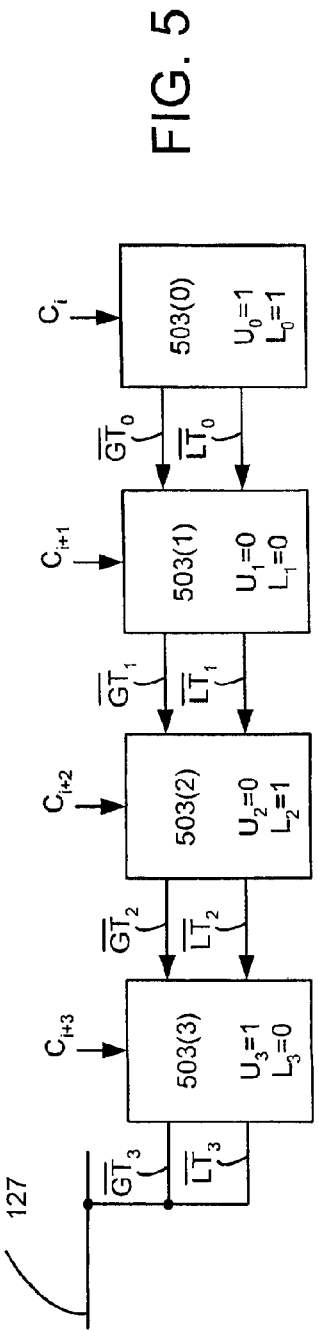
FIG. 5 depicts a chain of four ranging CAM cells that have exemplary upper bound and lower bound bits stored therein.

FIG. 5 depicts a chain of four ranging CAM cells 503(3)–503(0) that have exemplary upper bound and lower bound bits stored therein. Together, the four upper bound bits define the upper bound value 1001b ('b' indicating binary notation), or decimal 9. The four lower bound bits define the lower bound value 0101b, or decimal 5. Thus, the upper and lower bound values constitute an explicit range definition from 5 to 9 within a four-bit field. Consider the operation of the ranging CAM cells 503 when compared against a comparand in which a corresponding four-bit field (i.e., $C_{i+3}$–$C_i$, where i is an integer value indicating the offset of the field within the comparand) has the value 0111b (decimal 7). Applying the conditions CG1 and CG2 set forth above (and assuming that the least significant ranging CAM cell 503(0) is configured to produce an inclusive range definition), the least significant ranging CAM cell 503(0) will deassert the $GT_0$ signal (e.g., by allowing $GT_0$ to float or by outputting a logic high $GT_0$ signal) because the least significant bit of the comparand field, $C_i$, (a logic '1') is not greater than the upper bound value, $U_0$ (also a '1'). The next more significant ranging CAM cell 503(1) will assert the $GT_1$ signal because $C_{i+1}$, a '1,' is greater than upper bound value $U_1$, a '0.' Similarly, ranging CAM cell 503(2) will assert the $GT_2$ signal because $C_{i+2}$, a '1,' is greater than upper bound value $U_2$, a '0.' The most significant ranging CAM cell 503(3), however, will deassert the $GT_3$ signal because $C_{i+3}$, a '0,' is not greater than the upper bound value $U_3$, a '1,' (thereby preventing condition CG1 from being met), and because $C_{i+3}$ is not equal to the upper bound value $U_3$ (thereby preventing condition CG2 from being met).

Applying conditions CL1 and CL2 set forth above to compare the comparand field to the lower bound value, the least significant ranging CAM cell 503(0) will deassert the $LT_0$ signal because $C_i$ is not less than $L_0$. The next more significant ranging CAM cell 503(1) will deassert the $LT_1$ signal because $C_{i+1}$ is greater than $L_1$, thus preventing either condition CL1 or CL2 from being met. Ranging CAM cell 503(2) will deassert the $LT_2$ signal because $C_{i+2}$ is not less than $L_2$ (preventing condition CL1 from being met) and because signal $LT_1$ is not asserted, thereby preventing condition CL2 from being met. Similarly, the most significant ranging CAM cell 503(3) will deassert the $LT_3$ signal because $C_{i+3}$ is not less than $L_3$ and because signal $LT_2$ is not asserted. Finally, because neither the $LT_3$ signal nor the $GT_3$ signal is asserted, the match line 127 is not pulled down by the chain of ranging CAM cells 503. Accordingly, the chain of ranging CAM cells 503 signals a match, at least as to the comparand field $C_{i+3}$–$C_i$.

Still referring to FIG. 5, consider the operation of the ranging CAM cells 503 if the comparand field $C_{i+3}$–$C_i$ has a value of 1010b (decimal 10). Ranging CAM cell 503(1) will assert the $GT_1$ signal because $C_{i+1}$ is greater than $U_1$. Ranging CAM cell 503(2) will, in turn, assert the $GT_2$ signal because $C_{i+2}$ is equal to $U_2$ and the $GT_1$ signal is asserted. Finally, ranging CAM cell 503(3) will assert the $GT_3$ signal because $C_{i+3}$ is equal to $U_3$ and the $GT_2$ signal is asserted. The asserted $GT_3$ signal (i.e., logic low $\overline{GT_3}$ signal) will pull the match line 127 down to indicate that the comparand field does not match the range definition. The mismatch indication is as expected because the comparand value 10 is outside the range 5 to 9.

As another example, consider the operation of the ranging CAM cells 503 if the comparand field $C_{i+3}$–$C_i$ has a value of 0100b (decimal 4). Ranging CAM cell 503(0) will assert the $LT_0$ signal because $C_i$ is less than $L_0$. Ranging CAM cell 503(1) will, in turn, assert the $LT_1$ signal because $C_{i+1}$ is equal to $L_1$ and the $LT_0$ signal is asserted. Similarly, ranging CAM cell 503(2) will assert the $LT_2$ signal because $C_{i+2}$ is equal to $L_2$ and the $LT_1$ signal is asserted. Finally, ranging CAM cell 503(3) will assert the $LT_3$ signal because $C_{i+3}$ is equal to $L_3$ and the $LT_2$ signal is asserted. The asserted $\overline{LT_3}$ signal (i.e., logic low $\overline{LT_3}$ signal) will pull the match line 127 down to indicate that the comparand field does not match the range definition. Again, the mismatch indication is as expected because the comparand value 4 is outside the range 5 to 9.

Reflecting on the operation of ranging CAM cells 503, note that in a typical ternary CAM device, the following three CAM words would need to be stored in the CAM array to allow single-cycle comparison of the four-bit comparand field against the range 5 to 9:

1) exact value 5 (0101b);
2) bit-masked range 6–7 (011xb, the 'x' indicating a masked bit); and
3) and bit-masked range 8–9 (100xb).

By contrast, using the CAM cell chain of FIG. 5, only a single CAM word is needed to define the range 5 to 9. Note that a specific field size and range of numeric values have been shown in FIG. 5 for the purpose of example only. Numerous different numeric ranges may be defined within fields of more or fewer bits without departing from the spirit or scope of the present invention.

Figure 6:
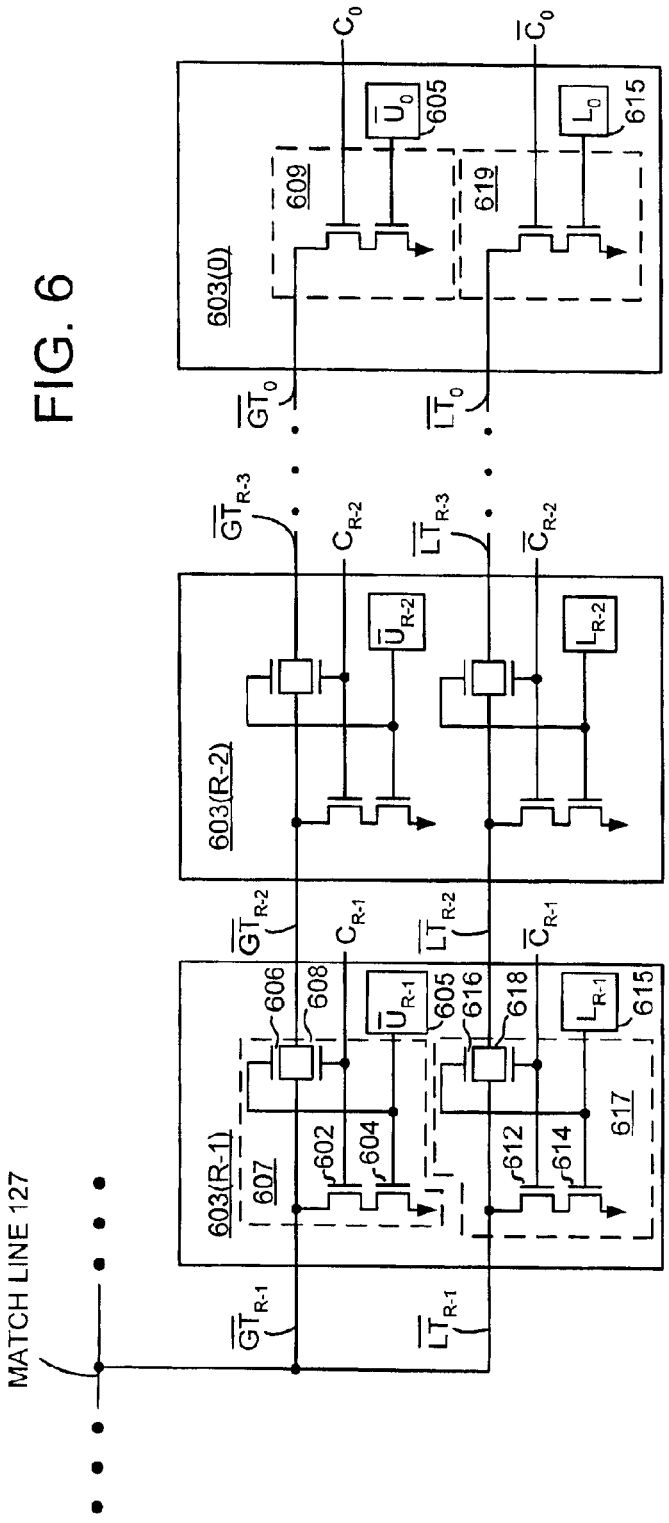
FIG. 6 illustrates a chain of ranging CAM cells according to an embodiment for storing an inclusive explicit range definition.

FIG. 6 illustrates a chain of ranging CAM cells 603(R–1)–603(0) according to an embodiment for storing an inclusive explicit range definition. Each ranging CAM cell 603 includes a pair of storage elements 605 and 615 to store an upper bound value and lower bound value, respectively. In one embodiment, each of the storage elements 605, 615 is a static storage element implemented as a bi-stable latch (e.g., back-to-back coupled inverters). In alternative embodiments, different types of storage elements may be used including, without limitation, dynamic storage elements (typically implemented by a single transistor and charge storage element), non-volatile storage elements or any other type of storage element that can be used to store digital data. Except for the least significant ranging CAM cell 603(0), each ranging CAM cell 603 includes an upper bound compare circuit 607 and a lower bound compare circuit 617 (each depicted as a dashed line box within CAM cell 603(R–1)). The upper bound compare circuit 607 includes a first pair of transistors 602 and 604 disposed to form a logic NAND gate having an output coupled to the GT output of the ranging CAM cell 603 and having first and second inputs coupled respectively to receive a comparand signal from a comparand line and to receive an upper bound value from the upper bound storage element 605. More specifically, a drain terminal of transistor 602 is coupled to the GT output of the CAM cell 603, a source terminal of transistor 602 is coupled to the drain terminal of transistor 604, and a gate terminal of transistor 602 is coupled to the comparand line to receive a comparand value C. A gate terminal of transistor 604 is coupled to the upper bound storage element to receive an active low version of the upper bound value (i.e., $\overline{U}$), and a source terminal of transistor 604 is coupled to a reference voltage (e.g., ground). Note that additional circuitry may be interposed between the source terminal of the transistor 604 and the reference voltage to provide for timing control of a range compare operation. For example, an additional transistor, controlled by a timing signal, may be coupled between the transistor 604 and a ground node such that, when the timing signal is asserted, the source terminal of the transistor 604 is coupled to the ground reference potential, thereby enabling the NAND function of the transistor pair 602, 604.

The upper bound compare circuit 607 further includes a second pair of transistors 606 and 608 disposed to form a logic OR gate having an output coupled to the GT output of the ranging CAM cell 603 and having first and second inputs coupled respectively to receive the comparand signal and to receive the upper bound value. More specifically, a drain terminal of transistor 606 is coupled to the GT output of the ranging CAM cell 603 and to a drain terminal of transistor 608. A source terminal of transistor 606 is coupled to a GT input of the ranging CAM cell 603 (i.e., to receive the GT signal output by a less significant ranging CAM cell) and to a source terminal of transistor 608. A gate terminal of transistor 606 is coupled to the gate terminal of transistor 604 and therefore to the upper bound storage element 605. A gate terminal of the transistor 608 is coupled to the gate terminal of transistor 602 and therefore to the comparand line.

The upper bound compare circuit 607 implements the following Boolean expression:

$$\overline{GT_i} = (C_i \cdot \bar{U}_i) + ((C_i + \bar{U}_i) \cdot \overline{GT_{i-1}}), \tag{1}$$

which, upon expansion of the second term, becomes the sum of products discussed above, namely:

$$\overline{GT_i} = (C_i \cdot \overline{U_i}) + (C_i \cdot \overline{GT_{i-1}}) + (\overline{U_i} \cdot \overline{GT_{i-1}}). \quad (2)$$

Figure 7:
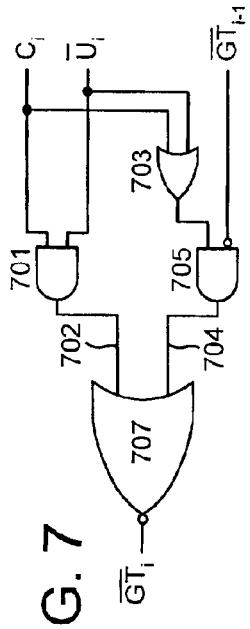
FIG. 7 is a logic diagram of an upper bound compare circuit.

FIG. 7 is a logic diagram of the upper bound compare circuit 607 and corresponds to the Boolean expression (1), above. More specifically, the comparand value $C_i$ is ANDed with a complemented upper bound value $\overline{U_i}$ in logic AND gate 701. Logic AND gate 701 outputs a signal 702 which, if set, indicates that $C_i$ is greater than $U_i$; the condition CG1 set forth above for asserting the active low $GT_i$ signal. The comparand value $C_i$ is also ORed with the complemented upper bound value $\overline{U_i}$ in logic OR gate 703. The output of the logic OR gate 703 is set if $C_i$ is greater than or equal to $U_i$. Consequently, if signal 702 is low (indicating that $C_i$ is not greater than $U_i$), then a high output from logic OR gate 703 indicates that $C_i$ is equal to $U_i$. The output of logic OR gate 703 is ANDed with the active low GT signal from the next less significant CAM cell (designated $\overline{GT_{i-1}}$ in FIG. 7) in logic AND gate 705 to produce signal 704. Signal 704, if high while signal 702 is low, indicates that $C_i$ is equal to $U_i$ and that the GT signal from the next less significant ranging CAM cell is asserted; the condition CG2 above for asserting the $GT_i$ signal. The signals 702 and 704 are ORed in logic NOR gate 707 to produce the active low $GT_i$ signal (designated $\overline{GT_i}$ in FIG. 7). Accordingly, if either signal 702 or 704 is asserted, indicating that either condition CG1 or condition CG2 is met, the $GT_i$ signal is asserted. Note that, in the wired NOR embodiments shown in FIGS. 4–6, the GT signal is active low. Alternative logic states may be used in other embodiments without departing from the spirit and scope of the invention.

Returning to FIG. 6, each ranging CAM cell (except the least significant) also includes a lower bound compare circuit 617. The lower bound compare circuit 617 includes transistors 612, 614, 616 and 618 coupled in the same manner as transistors 602, 604, 606 and 608, respectively, of the upper bound circuit 607 except that the gate terminals of transistors 612 and 618 are coupled to receive a complemented version of the comparand signal $\overline{C}$, the gate terminals of transistors 614 and 616 are coupled to the lower bound storage element to receive a lower bound value L, the drain terminals of the transistors 612, 616 and 618 are coupled to the LT output of the CAM cell instead of the GT output, and the source terminals of the transistors 616 and 618 are coupled to an LT input of the CAM cell (instead of the GT input) to receive an LT signal from a less significant ranging CAM cell. The lower bound compare circuit 617 implements the following Boolean expression:

$$\overline{LT_i} = (\overline{C_i} \cdot L_i) + ((\overline{C_i} + L_i) \cdot \overline{LT_{i-1}}), \quad (3)$$

which, upon expansion of the second term, becomes the sum of products discussed above, namely:

$$\overline{LT_i} = (\overline{C_i} \cdot L_i) + (\overline{C_i} \cdot \overline{LT_{i-1}}) + (L_i \cdot \overline{LT_{i-1}}). \quad (4)$$

Figure 8:
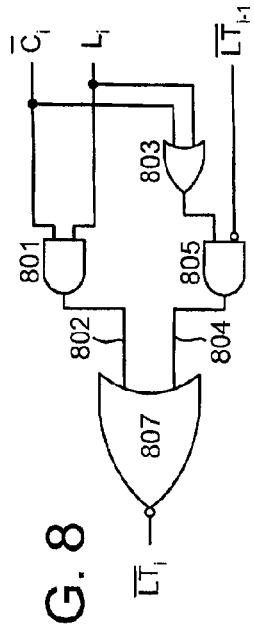
FIG. 8 is a logic diagram of a lower bound compare circuit.

FIG. 8 is a logic diagram of the lower bound compare circuit 617 and corresponds to the Boolean expression (3), above. More specifically, the complemented comparand value $\overline{C_i}$ is ANDed with the lower bound value $L_i$ in logic AND gate 801. Logic AND gate 801 outputs a signal 802 which, if set, indicates that $C_i$ is less than $L_i$; the condition CL1 set forth above for asserting the $LT_i$ signal. The complemented comparand value $\overline{C_i}$ is also ORed with the lower bound value $L_i$ in logic OR gate 803. The output of the logic OR gate 803 is set if $C_i$ is less than or equal to $L_i$. Consequently, if signal 802 is low (indicating that $C_i$ is not less than $L_i$), then a high output from logic OR gate 803 indicates that $C_i$ is equal to $L_i$. The output of logic OR gate 803 is ANDed with the active low LT signal from the next less significant CAM cell (designated $\overline{LT_{-1}}$ in FIG. 8) in logic AND gate 805 to produce signal 804. Signal 804, if high while signal 802 is low, indicates that $C_i$ is equal to $L_i$ and that the LT signal from the next less significant ranging CAM cell is asserted; the condition CL2 above for asserting the $LT_i$ signal. The signals 802 and 804 are ORed in logic NOR gate 807 to produce the active low $LT_i$ signal (designated $\overline{LT_i}$ in FIG. 8). Accordingly, if either signal 802 or 804 is asserted, indicating that either condition CL1 or condition CL2 is met, the $LT_i$ signal is asserted. Note that, in the wired NOR embodiments shown in FIGS. 4–6, the LT signal is active low. Alternative logic states may be used in other embodiments without departing from the spirit and scope of the invention.

Returning to the embodiment of FIG. 6, the least significant ranging CAM cell 603(0) differs from the other ranging CAM cells 603 in that no GT input signal is received. Accordingly, an upper bound compare circuit 609 within the ranging CAM cell 603(0) includes transistors 602 and 604 to compare the comparand value $C_0$ to the upper bound value $U_0$, but omits transistors 606 and 608 (which are used in the more significant ranging CAM cells to pass the state of the input GT signal to the GT output if the comparand value is equal to the upper bound value). As in the more significant ranging CAM cells, transistors 602 and 604 implement a logic NAND circuit to drive (i.e., pull) the $GT_0$ output low if the comparand value $C_0$ is greater than the upper bound value $U_0$.

The ranging CAM cell 603(0) also does not receive an LT input signal. Accordingly, a lower bound compare circuit 619 within the ranging CAM cell 603(0) includes transistors 612 and 614 to compare the comparand value $C_0$ to the lower bound value $L_0$, but omits transistors 616 and 618 (which are used in the more significant ranging CAM cells to pass the state of the input LT signal to the LT output if the comparand value is equal to the lower bound value). As in the more significant ranging CAM cells, transistors 612 and 614 implement a logic NAND circuit to drive (i.e., pull) the $LT_0$ output low if the comparand value $C_0$ is less than the lower bound value $L_0$.

Reflecting on the operation of the chain of CAM cells 603(R−1)–603(0), it can be seen that if the input comparand value (or selected field of bits therein) is identical to the overall upper bound value or lower bound value stored within the chain, the $GT_{R-1}$ and $LT_{R-1}$ signals will be deasserted (e.g., allowed to float or driven high), thereby signaling a match condition. The resulting inclusive range definition (i.e., range that includes bounding values) occurs because the $GT_0$ and $LT_0$ signals, which pass through each of the more significant ranging CAM cells to drive the $GT_{R-1}$ and $LT_{R-1}$ signals, respectively, are deasserted.

Figure 9:
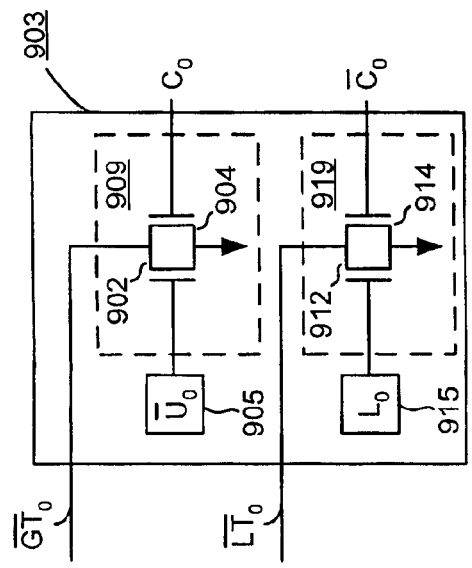
FIG. 9 illustrates an embodiment of a least significant ranging CAM cell that can be used in a chain of ranging CAM cells to store an exclusive range definition.

FIG. 9 illustrates an embodiment of a least significant ranging CAM cell 903 that can be used in place of ranging CAM cell 603(0) of FIG. 6 to allow storage of an exclusive range definition. The CAM cell 903 includes upper and lower bound storage elements 905 and 915 coupled respectively to upper and lower bound compare circuits 909 and 919. The upper bound compare circuit 909 includes transistors 902 and 904, each having a drain terminal coupled to the GT output of the CAM cell 903 and each having a source terminal coupled to a reference voltage (e.g., coupled to ground directly or through a timing control element). A gate terminal of transistor 902 is coupled to receive an inverted version of the upper bound value (i.e., $\overline{U_0}$) from the upper bound storage element 905, and a gate terminal of the transistor 904 is coupled to receive a comparand value $C_0$ from a comparand signal line. By this arrangement, the $GT_0$ signal is asserted (pulled low in this example) if the comparand value $C_0$ is high, or if the upper bound value $U_0$ is low. That is, the $GT_0$ signal is asserted if the comparand value $C_0$ is greater than or equal to the upper bound value $U_0$.

The lower bound compare circuit 919 includes transistors 912 and 914, each having a drain terminal coupled to the LT output of the CAM cell 903 and each having a source terminal coupled to a reference voltage (e.g., coupled to ground directly or through a timing control element). A gate terminal of the transistor 912 is coupled to receive the lower bound value $L_0$ from the lower bound storage element 915, and a gate terminal of the transistor 904 is coupled to receive a complemented comparand value (i.e., $\overline{C_0}$) from a comparand signal line. By this arrangement, the $LT_0$ signal is asserted (pulled low in this example) if the comparand value $C_0$ is low, or if the lower bound value $L_0$ is high. That is, the $LT_0$ signal is asserted if the comparand value $C_0$ is less than or equal to the lower bound value $L_0$.

Referring to FIGS. 6 and 9, consider the effect of substituting CAM cell 903 for CAM cell 603(0) within the chain of ranging CAM cells 603. If an input comparand, or field thereof, is bit-for-bit identical to an upper bound value stored in the chain of ranging CAM cells, CAM cell 903 will assert the $GT_0$ signal. Each of the more significant CAM cells in the chain 603 will forward the asserted $GT_0$ signal to the next more significant CAM cell in the chain such that the $GT_0$ signal will ultimately drive the $GT_{R-1}$ signal to a logic low state, signaling a mismatch. Similarly, if the comparand is bit-for-bit identical to a lower bound stored in the chain of ranging CAM cells, the CAM cell 903 will assert signal $LT_0$, and each of the more significant CAM cells in the chain 603 will forward the asserted $LT_0$ signal to the $LT_{R-1}$ output, again signaling a mismatch. Thus, if CAM cell 903 is included in the least significant position of a ranging CAM cell chain, a mismatch will be signaled by the chain if the comparand value is equal to either the upper or lower bound values stored within the chain. Accordingly, in such an embodiment, the upper and lower bound values stored within the chain of ranging CAM cells constitute an exclusive explicit range definition.

Although ranging CAM cells have been described in reference to FIGS. 4–9 as outputting both a GT and a LT signal, in alternative embodiments, a chain of CAM cells may generate only a GT signal or only a LT signal. Each CAM cell in such a chain may be implemented as described in reference to FIG. 6, but in a first case omitting the lower bound storage element and lower bound compare circuit, and in a second case omitting the upper bound storage element and upper bound compare circuit. In the first case, the chain of CAM cells may be used to store an implicit range definition having a stored upper bound and an implied lower bound (i.e., 00 . . . 0b, the lowest possible value for the corresponding field of bits within a comparand value). In the second case, the chain of CAM cells may be used to store an implicit range definition having a stored lower bound and an implied upper bound (i.e., 11 . . . 1b, the maximum possible value for the corresponding field of bits within a comparand value). In an alternative embodiment, the least significant CAM cell in the chain may be replaced by the CAM cell 903 of FIG. 9 (omitting either the lower bound storage element 915 and compare circuit 919, or the upper bound storage element 905 and compare circuit 909) so that an exclusive implicit range definition may be stored in the chain of CAM cells instead of an inclusive implicit range definition.

Figure 10:
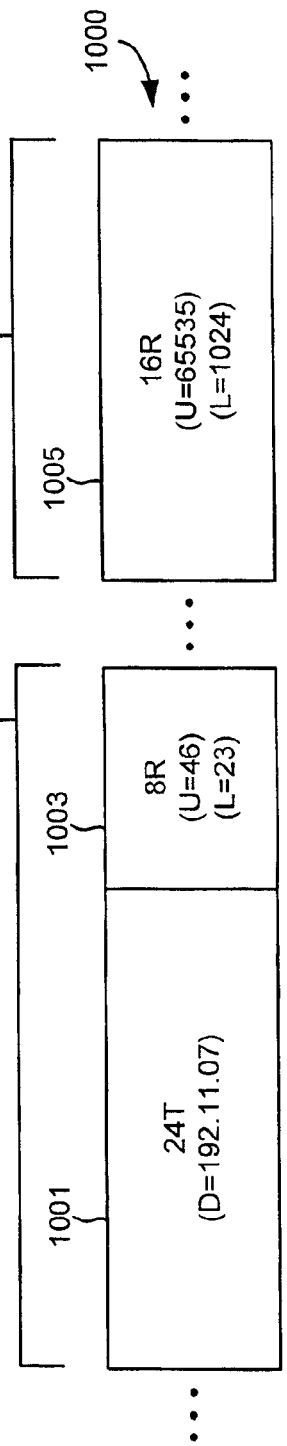
FIG. 10 illustrates the use of range definitions to express an exemplary classification rule within a single entry in a ranging CAM array.

FIG. 10 illustrates the use of range definitions to express an exemplary classification rule within a single entry in a ranging CAM array. Under the classification rule (which may be specified, for example, by a human operator), an incoming Internet Protocol (IP) packet having (1) a source port value between 192.11.07.23 to 192.11.07.46, inclusive, and (2) a destination port value greater than 1023 is to be classified as a class 0 packet.

To implement the source port component of the classification rule, the exact value 192.11.07 (each '.' delimited field within the source port value being an eight-bit value) is stored within a set of 24 ternary CAM cells 1001 within a row of CAM cells 1000, and an inclusive explicit range definition having an upper bound value of 46 and a lower bound value of 23 is stored in a chain of eight ranging CAM cells 1003 within the row of CAM cells 1000. If a comparand ranging from 192.11.07.23 to 192.11.07.46 is compared against the CAM word, the set of ternary CAM cells will indicate a match as to the exact value 192.11.07, and the chain of ranging CAM cells 1003 will indicate a match for the range from 23 to 46. To implement the destination port component of the classification rule (the destination port field being a sixteen-bit field), a chain of sixteen ranging CAM cells 1005 is used to store an inclusive explicit range definition having an upper bound value of 65535 and a lower bound value of 1024. Consequently, any comparand having a destination port value between 1024 and 65535, inclusive, will match the range definition. In an alternative embodiment, only the lower bound value of 1024 need be stored in the chain of ranging CAM cells 1005, with the upper bound value of 65535 being implied (i.e., an implicit range definition may be stored). Accordingly, the upper bound storage element and upper bound compare circuitry may be omitted from the chain of ranging CAM cells 1005.

As demonstrated by the classification example of FIG. 10, providing multiple distinct chains of ranging CAM cells within the row of CAM cells 1000 enables multiple range compare operations to be performed simultaneously on respective fields of a comparand, yet requires storage of only a single CAM word. As discussed above in FIG. 1, a typical ternary CAM array requires storage of thirty-six CAM words to produce the same single-cycle comparison result. Additional chains of ranging CAM cells may be used to store range definitions for other fields within incoming comparand values, potentially saving even more CAM array storage.

Multi-Mode CAM Cell

As mentioned above, multi-mode CAM cells are CAM cells that may be selectively operated in different modes. In one embodiment, for example, a multi-mode CAM cell may be switched between a ternary mode of operation and a ranging mode of operation. In another embodiment, a multi-mode CAM cell may be switched between a binary mode of operation and a ranging mode of operation. In yet another embodiment, a multi-mode CAM cell may be switched between different ranging CAM cell modes.

Figure 11:
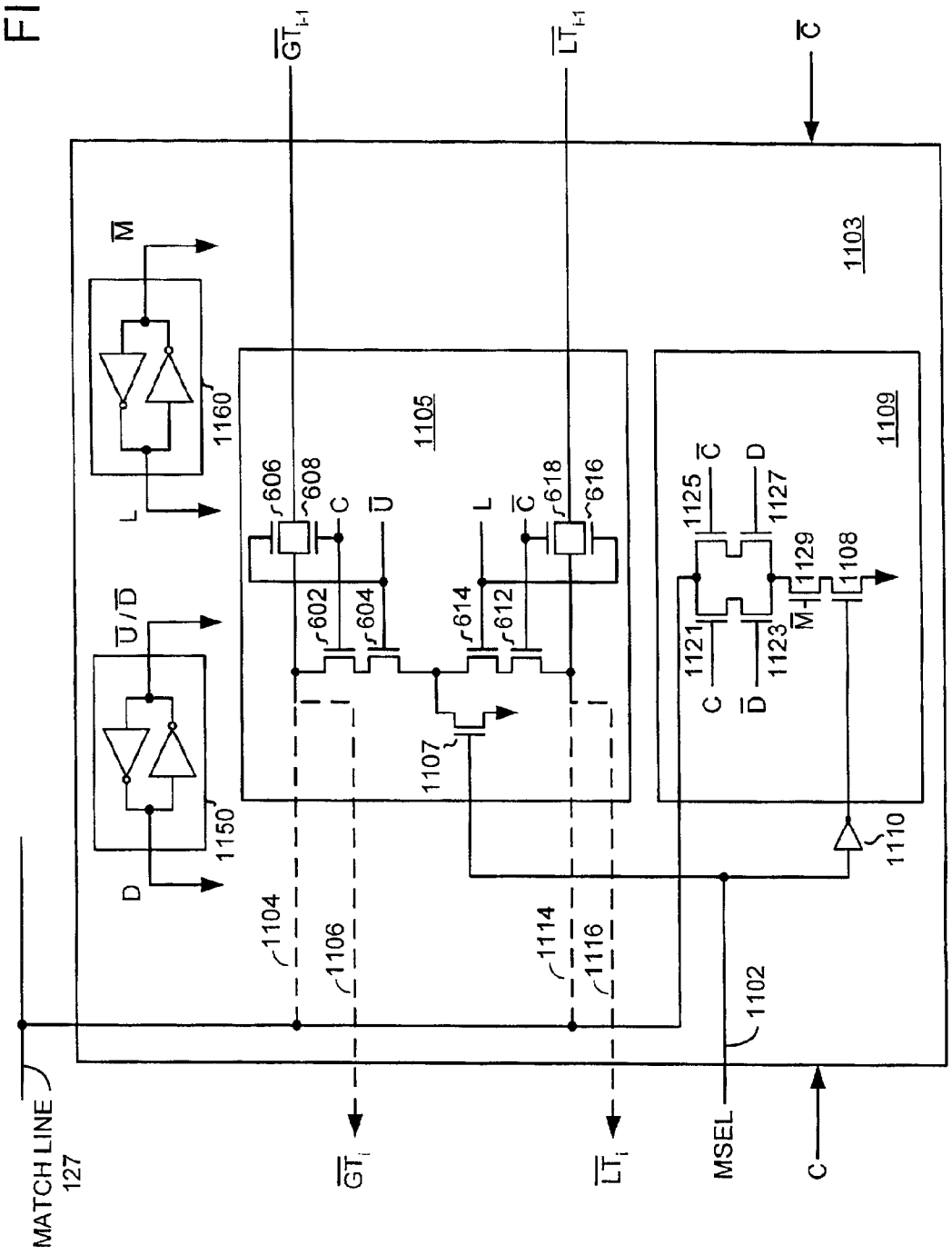
FIG. 11 illustrates a multi-mode CAM cell according to one embodiment.

FIG. 11 illustrates a multi-mode CAM cell 1103 according to one embodiment. The multi-mode CAM cell 1103 includes a pair of storage elements 1150 and 1160, a range compare circuit 1105, a ternary compare circuit 1109, and a mode select input to receive a mode select signal 1102. The state of the mode select signal 1102, high or low, selects either a ternary or ranging mode of operation for the multi-mode CAM cell 1103 by enabling either the range compare circuit 1105 or the ternary compare circuit 1109 and disabling the other.

The significance of the data stored in the storage elements 1150 and 1160 depends upon the operating mode of the multi-mode CAM cell 1103. When the CAM cell 1103 is in the ternary mode, the storage element 1150 is used to store a data value and the storage element 1160 is used to store a mask value. By contrast, when the CAM cell 1103 is in the range mode, the storage element 1150 is used to store an upper bound value and the storage element 1160 is used to store a lower bound value. In the embodiment of FIG. 11, the storage elements 1150 and 1160 are implemented by back-to-back inverters, but, as discussed in reference to FIG. 6, numerous other types of storage cells may be used in alternative embodiments.

The range compare circuit 1105 includes an upper bound compare circuit to generate a GT signal ($GT_i$) and a lower bound compare circuit to generate a LT signal ($LT_i$). The upper bound compare circuit is implemented by transistors 602, 604, 606 and 608, which are coupled to one another and coupled to receive a complemented upper bound value $\overline{U}$ from storage element 1150, an incoming GT signal ($GT_{i-1}$), and a comparand value C, all as described above in reference to FIG. 6. The lower bound compare circuit is implemented by transistors 612, 614, 616 and 618, which are coupled to one another and coupled to receive a lower bound value L from storage element 1160, an incoming LT signal ($LT_{i-1}$), and a complemented comparand value $\overline{C}$, also as described in reference to FIG. 6. Unlike the embodiment of FIG. 6, however, the source terminals of transistors 604 and 614 are coupled to the drain terminal of a range mode enable transistor 1107, rather than directly to a reference voltage. A source terminal of the range mode enable transistor 1107 is coupled to a ground reference voltage (additional circuitry such as timing control circuitry may be interposed between the source terminal of transistor 1107 and the reference voltage), and a gate terminal of the range mode transistor 1107 is coupled to receive the mode select signal 1102. Thus, when the mode select signal 1102 is high, the range mode enable transistor 1102 is switched on, coupling the source terminals of transistors 604 and 614 to the ground reference voltage (plus a Vt drop through transistor 1107) and enabling the upper and lower bound compare circuits within the range compare circuit 1105. When the mode select signal 1102 is low, the range mode enable transistor 1107 is switched off (i.e., little or no current flows between the drain and source of transistor 1107), disabling the upper and lower bound compare circuits from asserting the $GT_i/LT_i$ signals. As indicated by dashed lines 1104, 1106, 1114 and 1116, the $GT_i$ and $LT_i$ outputs of the range compare circuit 1105 are alternatively coupled to a match line 127 or output to a more significant CAM cell in a chain of ranging or multi-mode CAM cells. In an alternative embodiment, switches (e.g., transistor switches or logic gates responsive to a select signal) or fuses may be used to couple the $GT_i$ and $LT_i$ outputs to (or decouple the $GT_i$ and $LT_i$ outputs from) the match line 127 in a run-time or production-time configuration operation.

The ternary compare circuit 1109 includes two pairs of compare transistors 1121/1123 and 1125/1127, mask transistor 1129, and ternary mode enable transistor 1108. Transistors 1121, 1123, 1129, and 1108 are coupled in series between a ground reference voltage and match line 127. Gate terminals of the compare transistors 1121 and 1123 are coupled to receive, respectively, a comparand value C from a comparand line and a complemented data value $\overline{D}$ from the storage element 1150. A gate terminal of the mask transistor 1129 is coupled to receive a complemented mask value $\overline{M}$ from storage element 1160, and a gate terminal of the ternary mode enable transistor 1108 is coupled to receive, via inverter 1110, a complemented version of the mode select signal 1102. Compare transistors 1125 and 1127 are coupled in series between the match line 127 and mask transistor 1129, such that transistors 1125, 1127, 1129 and 1108 also form a series path between the match line and a ground reference voltage. The gate terminals of the compare transistors 1125 are coupled to receive, respectively, a complemented comparand bit $\overline{C}$ from a comparand line, and a data value D from the storage element 1150.

When the mode select signal 1102 is high, the output of inverter 1110 will be low, switching off transistor 1108. In this state, the ternary compare circuit is disabled from affecting the state of the match line 127, regardless of the values stored in the storage elements 1150 and 1160. When the mode select signal 1102 is low, the output of inverter 1110 will be high, switching on transistor 1108 and enabling the ternary compare circuit.

When the ternary compare circuit is enabled and a logic '1' is stored in the storage element 1160, the complemented match signal $\overline{M}$ will be low, switching off transistor 1129 and preventing the ternary compare circuit from affecting the state of the match line 1127, regardless of the relative states of data and comparand values. That is, the comparison operation is masked such that the ternary CAM cell effectively stores a "don't care state." When the ternary compare circuit is enabled and a logic '0' is stored in the storage element 1160, the compare transistor pairs 1121/1123 and 1125/1127 will complete a path between the match line and the ground reference potential (thereby pulling the match line low to signal a mismatch condition) if the data value stored in the storage element 1150 does not match an incoming comparand value. For example, if the stored data value is a logic '1' and the comparand value is a logic '0' (a first possible mismatch condition) the complemented comparand signal $\overline{C}$ and the data signal D will both be high, switching on transistors 1125 and 1127. If the stored data value is a logic '0' and the comparand value is a logic '1' (a second possible mismatch condition), the comparand signal C and the complemented data signal will both be high, switching on transistors 1121 and 1123.

Note that the masking function of the ternary compare circuit is achieved by using mask transistor 1129 to interrupt the path between the pairs of compare transistors and the ground reference. In alternative embodiments, the mask transistor may instead be disposed between the ground reference and the ternary mode enable transistor 1108, or between the match line 1127 and the pairs of compare transistors 1121/1123 and 1125/1127. Also, masking techniques other than path interruption may be used in alternative embodiments, including without limitation, disabling the data value from being received by transistors 1123 and 1127 (e.g., switching off transistors 1123 and 1127 if the mask value is a logic '1'), and/or disabling the comparand value from being received by transistors 1121 and 1125 (e.g., switching off transistors 1121 and 1125 if the mask value is a logic '1'). Such masking techniques are described in WIPO International Publication Number WO 99/23663. In other embodiments, circuitry to implement the masking function may be omitted altogether so that the mode select signal 1102 effectively switches the multi-mode CAM cell 1103 between binary mode (rather than ternary mode) and ranging mode. Also, multiple compare circuits may be included within each multi-mode CAM cell 1103 (e.g., to enable pipelined or parallel compare operations), and the match signal output from the compare circuit 1109 may be combined in a NAND structure, as described above, instead of the wired NOR structure shown in FIG. 11.

Figure 12:
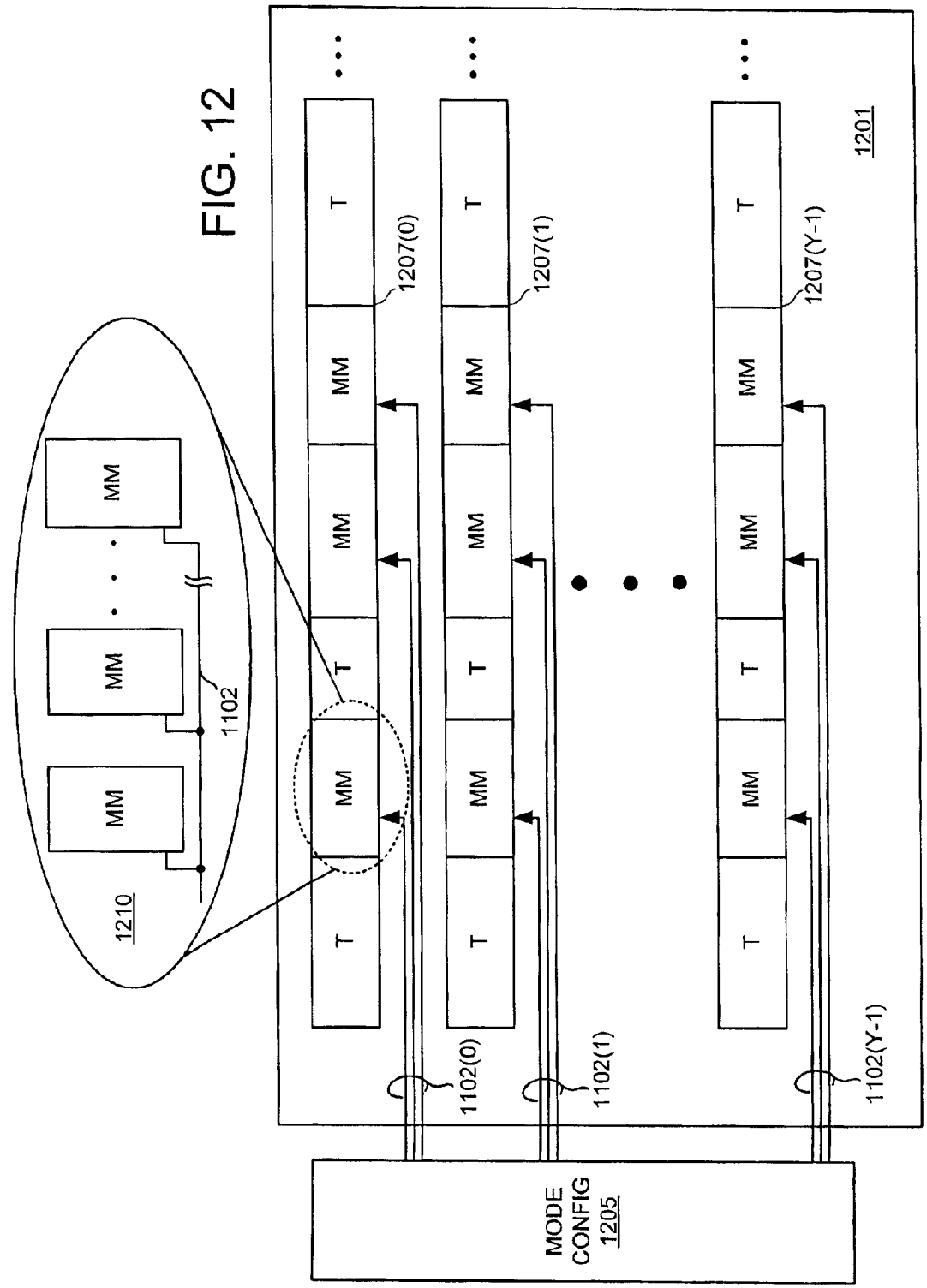
FIG. 12 illustrates a mode configuration circuit that may be used to set the operating modes of multi-mode CAM cells within a ranging CAM array.

FIG. 12 illustrates a mode configuration circuit 1205 that may be used to set the operating modes of multi-mode CAM cells within an exemplary ranging CAM array 1201. The ranging CAM array 1201 includes Y rows of CAM cells 1207(0)–1207(Y−1), each including a number of distinct sets of ternary CAM cells (T) and a number of distinct sets of multi-mode CAM cells (MM). Each set of ternary and multi-mode CAM cells may include any number of CAM cells and may be disposed at any location within a CAM row. Also, while each CAM row 1207 is shown as having ternary and multi-mode CAM cells disposed in the same order and location as in the other rows, the relative order and locations of the sets of ternary and multi-mode CAM cells may vary from row to row in alternative embodiments. Sets of dedicated ranging CAM cells may be included in the CAM array 1201 instead of or in addition to the sets of ternary CAM cells in alternative embodiments, and, in yet other embodiments, all the CAM cells in the CAM array 1201 may be multi-mode CAM cells.

In the embodiment of FIG. 12, the mode configuration circuit 1205 outputs a respective set of mode select signals 1102(0)–1102(Y−1) to each of the rows of CAM cells 1207(0)–1207(Y−1). Each mode select signal 1102 in a given set of signals is coupled to the mode select input of each multi-mode CAM cell in a given set of multi-mode CAM cells as shown by inset 1210. Accordingly, the state of each individual mode select signal selects the operating mode for a respective set of multi-mode CAM cells within the CAM array 1201, thereby enabling each set of multi-mode CAM cells to be operated in either ranging mode or ternary mode (or binary mode) regardless of the operating mode of the other sets of multi-mode CAM cells. In one embodiment, the mode configuration circuit 1205 includes storage elements (e.g., registers) that may be programmed by a host processor to set the state of the individual mode select signals 1102, and therefore the operating modes of the various multi-mode CAM cells within the CAM array 1201. In an alternative embodiment, the mode configuration register includes one-time programmable fuses that may be blown, for example at production time, to permanently set the state of the individual mode select signals and establish a particular configuration for the CAM array 1201. In alternative embodiments, a single set of mode select signals may be provided (i.e., instead of a separate set of signals per row of CAM cells) and used to set the operating modes for the CAM array such that each row of CAM cells 1207(0) –1207(Y−1) has the same configuration. Also, instead of multiple mode select signals, a single mode select signal may be input to each multi-mode CAM cell in the CAM array 1201 to set the operating mode for each multi-mode CAM cell in the CAM array 1201. Further, the mode select signal may be provided from an external source (e.g., a host processor or other device, or by strapping) instead of from the mode configuration circuit 1205.

Figure 13:
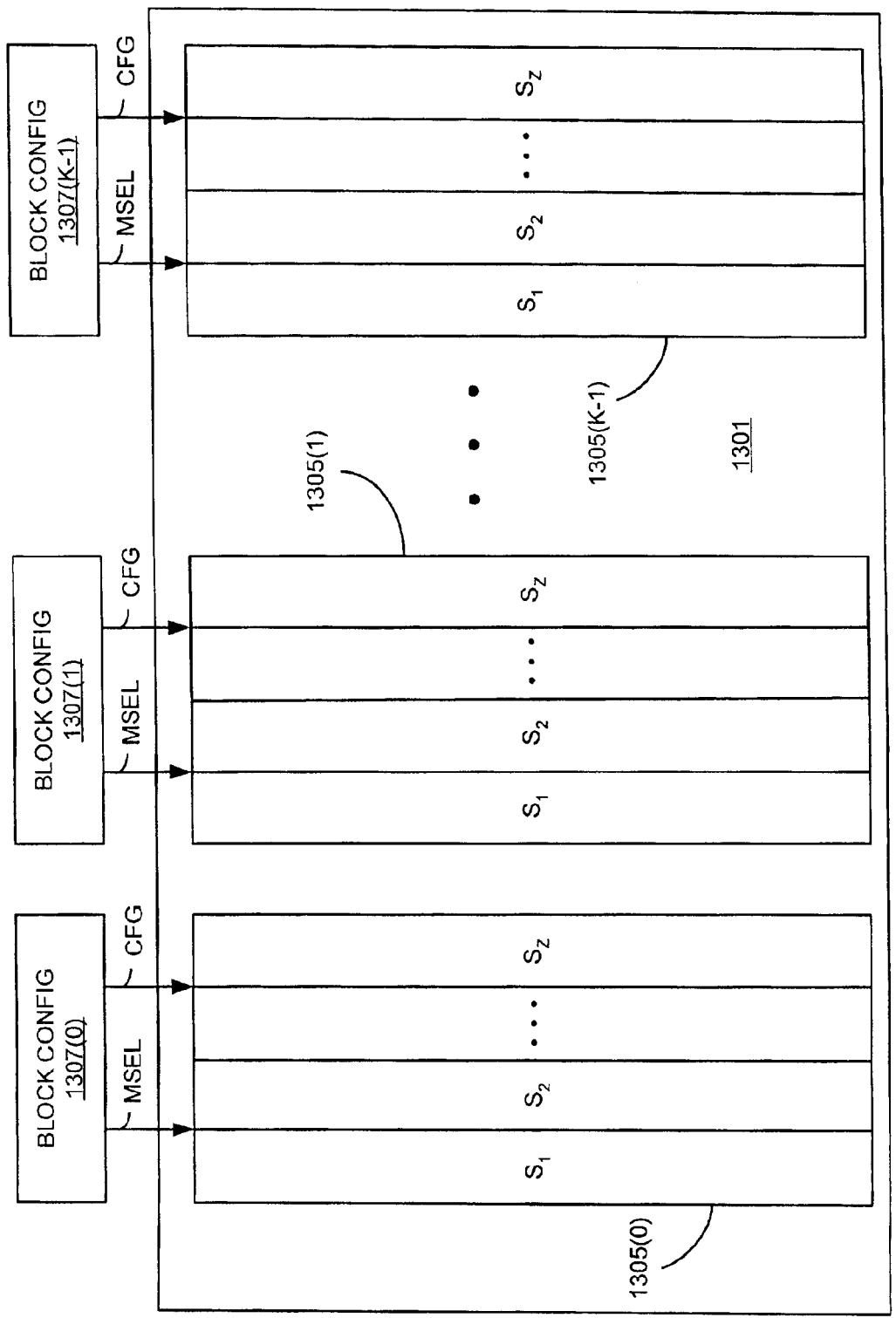
FIG. 13 illustrates an embodiment of a ranging CAM array that includes multiple independently addressable and searchable blocks of CAM cells.

FIG. 13 illustrates an embodiment of a ranging CAM array 1301 that includes multiple independently addressable and searchable blocks of CAM cells 1305(0)–1305(K−1). Such storage blocks are referred to herein as CAM blocks. Each row of CAM cells within a given CAM block 1305 includes multiple row segments, $S_1$–$S_Z$, that may be alternately configured to store an individual CAM word or a portion of a CAM word that spans two or more row segments. The storage width and depth of the CAM block is effectively determined by the configuration of the row segments. Assume, for example, that a given CAM block 1305 includes Y rows of CAM cells, Z row segments per row, and W CAM cells per row segment. If the row segments within the CAM block 1305 are configured to store CAM words that span all Z row segments, then the storage width of the CAM block becomes W×Z and the storage depth of the CAM block becomes Y. Alternatively, if the row segments within the CAM block 1305 are configured to store a single CAM word per row segment, then the storage width of the CAM block becomes W and the storage depth of the CAM block becomes Z×Y. Other width/depth configurations between the W×Z by Y and W by Z×Y configurations may also be achieved (e.g., W×(Z/2) by Y×(Z/2)).

To add further flexibility in the configuration of the CAM blocks 1305, each of the individual row segments within each CAM block may include different types of CAM cells including one or more sets of ternary (or binary) CAM cells, ranging CAM cells and/or multi-mode CAM cells. Block configuration circuits 1307(0)–1307(K−1) are provided to control the respective width/depth configurations of the CAM blocks 1305 and to set the operating modes of multi-mode CAM cells within the CAM blocks 1305. In the embodiment of FIG. 13, for example, each block configuration circuit 1307 outputs one or more sets of mode select signals (MSEL) to a corresponding one of the CAM blocks 1305 in the manner described in reference to FIG. 12, and each block configuration circuit 1307 also outputs a width/depth configuration signal (CFG) to set the width/depth configuration of the corresponding CAM block 1305. As in the CAM array 1201 of FIG. 12, the individual sets of multi-mode CAM cells within a given CAM block 1305 may each receive a dedicated mode select signal, or mode select signals may be shared between some or all of the sets of multi-mode CAM cells.

Figure 14:
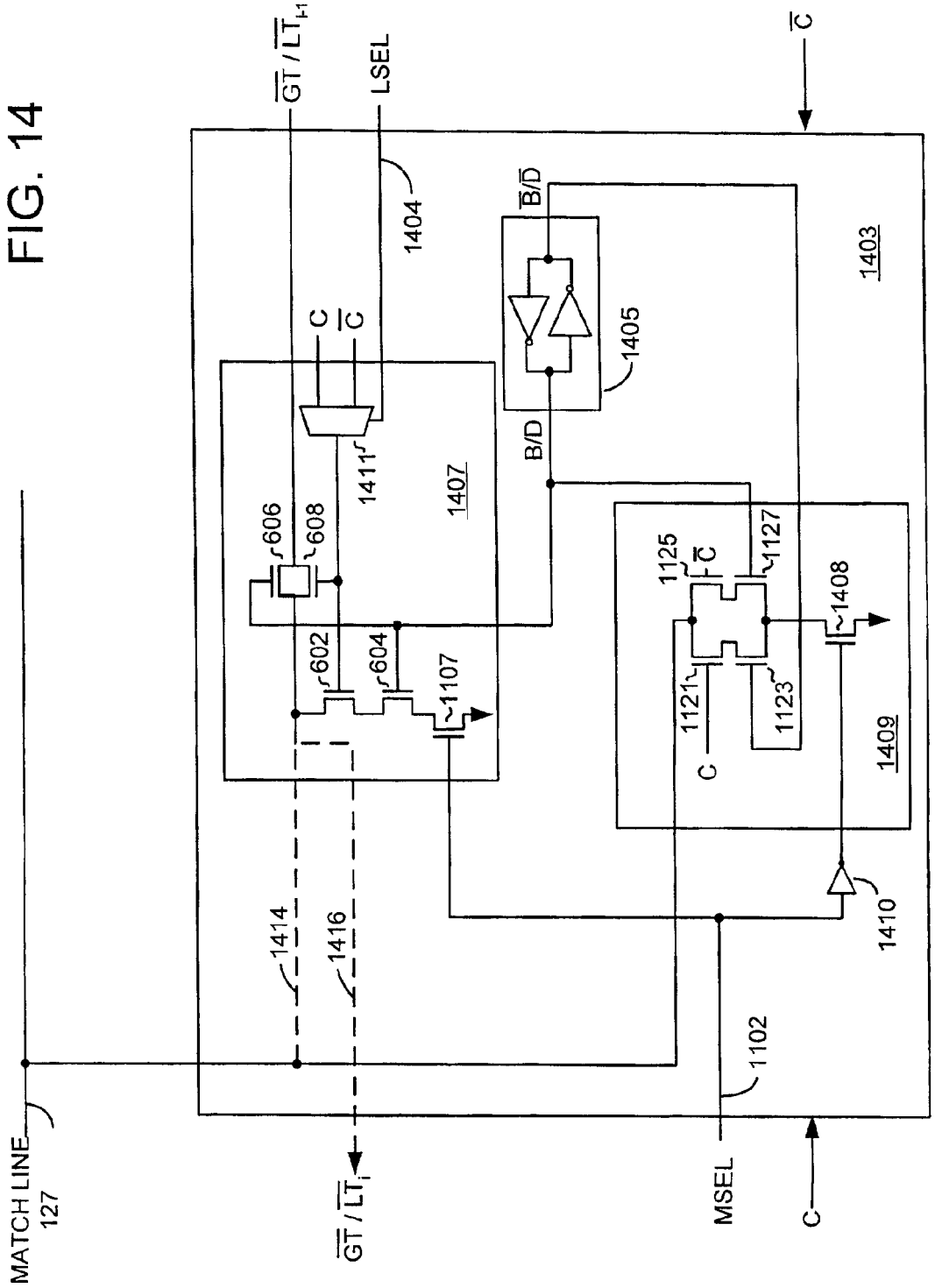
FIG. 14 illustrates a multi-mode CAM cell that may be switched between an implicit range mode and a binary mode.

FIG. 14 illustrates a multi-mode CAM 1401 cell that may be switched between an implicit range mode and a binary mode. The CAM cell 1401 includes a storage element 1405, a range compare circuit 1407 and a binary compare circuit 1409. The storage element 1405 is implemented by a pair of back-to-back coupled inverters and is used, alternatively, to store a boundary value B for use in the range compare circuit 1407 or a data value D for use by the binary compare circuit 1409. As discussed in reference to FIG. 6, numerous other types of storage cells may be used to implement storage element 1405 in alternative embodiments.

The range compare circuit 1407 includes transistors 602, 604, 606 and 608 each coupled as described in reference to FIG. 6 except that the source terminal of transistor 604 is coupled to the drain terminal of a range mode enable transistor 1107, and the gate terminals of transistors 602 and 608 are coupled to the output of a multiplexer 1411 instead of directly to a comparand line. The range mode enable transistor 1107 is coupled between the source terminal of transistor 604 and a reference voltage as described in reference to FIG. 11, and is responsive to a mode select signal 1102 to either enable or disable the range compare circuit 1407. More specifically, when the mode select signal 1102 is high, transistor 1107 is switched on, enabling the range compare circuit 1407. When the mode select signal is low, transistor 1107 is switched off, disabling the range compare circuit 1407.

The multiplexer 1411 is responsive to a level select signal 1404 to select between a comparand value C and its complement $\overline{C}$. When the level select signal 1404 is in an upper bound state (e.g., high), the comparand value C is selected to be output to the gate terminals of transistors 602 and 608, and the boundary value B is treated as the complement of an upper bound value. That is, the range compare circuit 1407 compares the comparand value C and the upper bound value as described above in reference to FIG. 6, asserting a $GT_i$ signal at the drain terminal of transistor 602 if the comparand C is greater than the upper bound value, or if the comparand C is equal to the upper bound value and a $GT_{i-1}$ signal is asserted at the source terminals of transistors 606 and 608.

When the level select signal 1404 is in a lower bound state (e.g., low), the complemented comparand value $\overline{C}$ is selected to be output to the gate terminals of transistors 602 and 608, and the boundary value B is treated as a lower bound value. The range compare circuit 1407 compares the complemented comparand value $\overline{C}$ and the lower bound value as described above in reference to FIG. 6, asserting an $LT_i$ signal at the drain of the transistor 602 if the comparand is less than the lower bound value, or if the comparand is equal to the lower bound value and a $LT_{i-1}$ signal is asserted at the source terminals of transistors 606 and 608. Thus, the GT/LTi signal output from the range compare circuit 1407 represents either a GT signal or a LT signal according to the state of the level select signal 1404. Similarly, the GT/LTi–1 signal input from a less significant multi-mode CAM cell (or dedicated ranging CAM cell) is deemed to be either a GT signal or a LT signal according to the state of the level select signal 1404. By this arrangement, the level select signal may be used to switch the implicit range compare function of the multi-mode CAM cell 1403 to either a greater-than compare or a less-than compare. As with the GTi and LTi outputs of the CAM cell described in reference to FIG. 11, the GT/LTi output of the multi-mode CAM cell 1403 may either be coupled to the match line 127 as shown by dashed line 1414 (e.g., if the multi-mode CAM cell 1403 is the most significant CAM cell in a chain) or coupled to the GT/LT input of a more significant CAM cell in a CAM cell chain as shown by dashed line 1416. Respective level select signals 1404 may be output to individual chains of multi-mode CAM cells 1403 by a configuration circuit similar to the mode configuration circuit of FIG. 1205, or a single level select signal 1404 may be shared by multiple (or all) chains of multi-mode CAM cells 1403 within a CAM array. Also, the block configuration circuits 1307(0)–1307(K–1) of FIG. 13 may additionally output one or more level select signals 1404 to control the compare function within chains of multi-mode CAM cells 1403 within the configurable blocks 1305(0)–1305(K–1). Alternatively, the level select function (i.e., the function implemented by multiplexer 1411 and level select signal 1404) may be omitted altogether from the multi-mode CAM cell 1403. In that case, one or the other of the comparand values (C or $\overline{C}$) may be input directly to the gate terminals of transistors 602 and 608 to implement either an upper bound or lower bound compare function. For example, the signal line used to carry the uncomplemented comparand value C may be coupled directly to the gate terminals of transistors 602 and 608, and a complemented upper bound value $\overline{U}$ applied to the gate terminals of transistors 604 and 606, thus implementing an upper bound compare function. A lower bound compare function may be implemented without circuit change within CAM cell 1403 by inverting the interpretation of the value stored in the storage element 1405 (i.e., interpret the stored value as $\overline{L}$ instead of U, such that a stored '1'=$\overline{L}$, and a stored '0'=L) and by inverting the interpretation of the comparand signals issued on the signal line used to carry the uncomplemented comparand value (i.e., interpret the comparand value as $\overline{C}$ instead of C (i.e., signal level '0'=C, and signal level '1'=$\overline{C}$). Such inversions may be accomplished at a system level by a host processor or other device.

Figure 1:
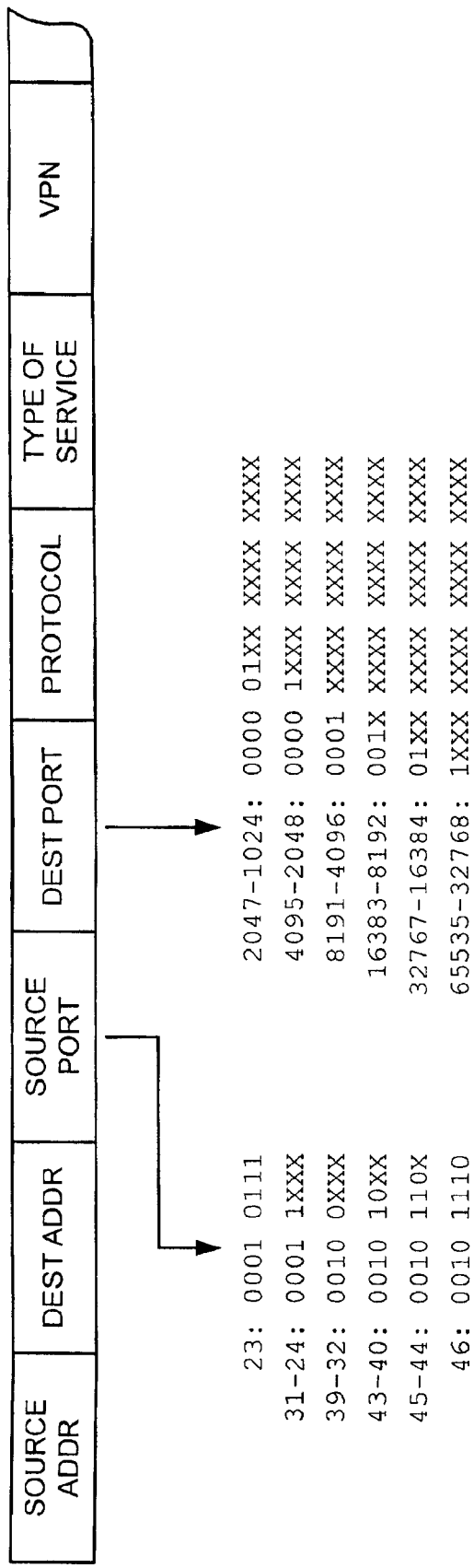
FIG. 1 illustrates a combination of exact and mask-based values that may be stored in a prior art CAM device to cover a desired range of source port and destination port values.

Still referring to FIG. 14, the binary compare circuit 1409 includes transistors 1121, 1123, 1125 and 1127 coupled as described in reference to FIG. 1, except that the source terminals of transistors 1123 and 1127 are coupled to the drain terminal of a binary mode enable transistor 1408. A source terminal of the binary mode enable transistor is coupled to a reference voltage (e.g., directly or through a timing control circuit) and a gate terminal of the binary mode enable transistor 1408 is coupled, through an inverter 1410, to the mode select signal 1102. Thus, when the mode select signal is low, transistor 1107 is switched off to disable the range compare circuit 1407 and transistor 1408 is switched on to enable the binary compare circuit 1409. When enabled, the binary compare circuit 1409 pulls the match line 127 to a low logic level if the comparand value does not match the data value stored in storage element 1405 (i.e., if C and $\overline{D}$ are high, or if $\overline{C}$ and D are high). When the mode select signal 1102 is low, transistor 1107 is switched on to enable the range compare circuit 1407 and transistor 1408 is switched off to disable the binary compare circuit 1409.

Figure 15:
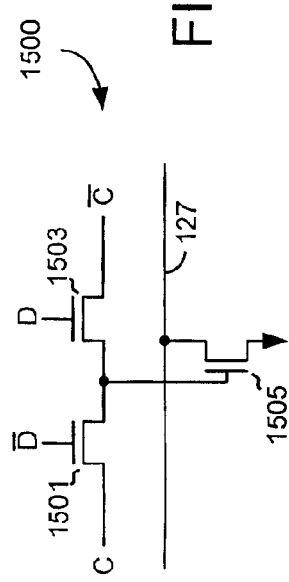
FIG. 15 illustrates an alternative compare circuit that may be used in place of the binary compare circuit of FIG. 14.

FIG. 15 illustrates an alternative compare circuit 1500 that may be used in place of the binary compare circuit 1409 of FIG. 14. Compare circuit 1500 includes a first transistor 1505 coupled between a reference potential (e.g., ground) and a match line 127. A gate terminal of the transistor 1505 is coupled to a drain terminal of a second transistor 1501 and to a drain terminal of a third transistor 1503. Source terminals of transistors 1501 and 1503 are coupled to receive a comparand signal and its complement, respectively, while gate terminals of transistors 1501 and 1503 are coupled to receive a complemented data value (e.g., a complement of the data value stored in storage element 1405 of FIG. 14), and an uncomplemented data value, respectively. By this arrangement, if the comparand signal is high and the data value is low (a mismatch condition), transistor 1501 will be switched on, passing the comparand signal (i.e., high logic level signal) to the gate of transistor 1505. Transistor 1505 will be switched on in response to the high logic level signal at its gate terminal, coupling the match line to the reference voltage to indicate the mismatch condition. Similarly, if the comparand is low and the data value is high (also a mismatch condition), transistor 1503 will be switched on, passing the complemented comparand signal (i.e., high logic level signal) to the gate terminal of transistor 1505. Again, transistor 1505 will be switched on, coupling the match line 127 to the reference voltage to indicate the mismatch condition.

Figure 16:
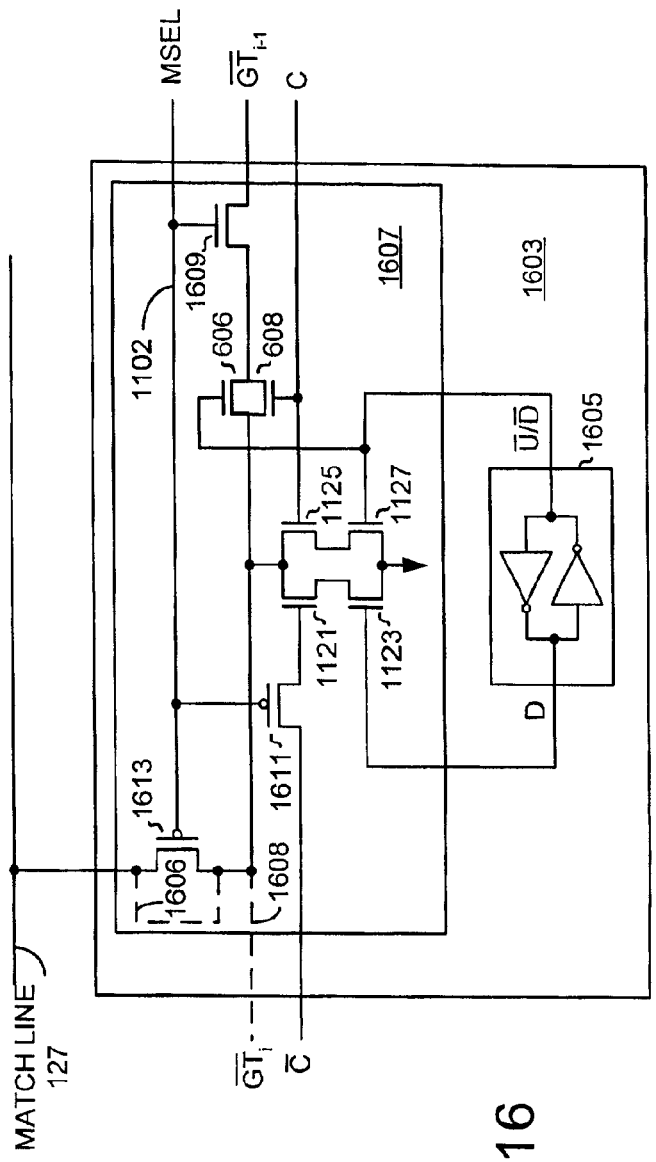
FIG. 16 illustrates a multi-mode CAM cell according to another alternative embodiment.

Note that compare circuit 1505 may be modified to enable a ternary compare operation, for example, by including an additional transistor in series with transistor 1505 (i.e., between the reference potential and the match line 127) and coupling a gate terminal of the additional transistor to a match value. Alternatively, circuitry responsive to a match value may be used to prevent logic high data and/or comparand signals from being applied to the terminals of transistors 1501 and 1503. In general, any circuit for detecting a mismatch between data and comparand values may be used to implement compare circuits within the binary and ternary CAM cells described herein, and any circuit for preventing a compare circuit from indicating a mismatch condition may be used as a masking circuit within the ternary CAM cells described herein. Moreover, as discussed above, multiple compare circuits may be included within each CAM cell disclosed herein and the match outputs of a set of CAM cells may be coupled in a NAND structure (e.g., pass gates coupled in series between a match line output and a reference voltage) instead of the NOR structure shown, for example, in FIGS. 11 and 14. FIG. 16 illustrates a multi-mode CAM cell 1603 according to another alternative embodiment. The multi-mode CAM cell 1603 includes a storage element 1605 and a mode-selectable compare circuit 1607. The storage element 1605 is implemented by a pair of back-to-back coupled inverters and is used, alternatively, to store a boundary value (an upper bound value, U, in this example) for use in a range comparison or a data value D for use in a binary comparison. As discussed in reference to FIG. 6, numerous other types of storage cells may be used to implement storage element 1605 in alternative embodiments.

The mode-selectable compare circuit 1607 includes transistors 1121, 1123, 1125 and 1127 coupled to one another in the manner discussed above in reference to FIGS. 11 and 14. The gate terminals of transistors 1123 and 1127 are coupled to receive complementary signals (e.g., D and $\overline{D}$, respectively) from the storage element 1605, and the gate terminal of transistor 1125 is coupled to receive a comparand value C from a comparand signal line. Transistors 606 and 608 are coupled to one another in the same manner as described above in reference to FIG. 6. The drain terminals of transistors 606 and 608 are coupled to the drain terminal of transistor 1125 and the gate terminals of transistors 606 and 608 are coupled to the gate terminals of transistors 1127 and 1125 respectively. Together, transistors 1125, 1127, 606 and 608 form a range compare circuit in the same manner as transistors 602, 604, 606 and 608, respectively, of FIG. 6.

The mode selectable circuit further includes transistors 1609, 1611 and 1613, each having a gate terminal coupled to receive the mode select signal 1102. A drain terminal of transistor 1609 is coupled to the source terminals of transistors 606 and 608, and a source terminal of transistor 1609 is coupled to receive an input GT signal (e.g., $GT_{i-1}$). A drain terminal of transistor 1611 is coupled to a gate terminal of transistor 1121, and a source terminal of transistor 1611 is coupled to receive a complemented comparand signal from a comparand signal line. A drain terminal of transistor 1613 is coupled to the match line 127, and a source terminal of transistor 1613 is coupled to the drain terminals of transistors 1121 and 1125. In the embodiment of FIG. 16, transistors 1613 and 1611 are PMOS (Positively doped, Metal Oxide Semiconductor) devices that are switched on (i.e., enter a conducting state) when the mode select signal 1102 is low, and switched off when the mode select signal 1102 is high. Transistor 1609 is an NMOS (Negatively doped, Metal Oxide Semiconductor) device that is switched on when the mode select signal 1102 is high, and switched off when the mode select signal is low.

When the mode select signal 1102 is high, a range mode of operation is selected for the CAM cell 1603, with transistor 1609 being switched on to allow a GT input signal (i.e., $GT_{i-1}$) to be received at the source terminals of transistors 606 and 608, transistor 1611 being switched off to prevent the complemented comparand signal from being received at the gate terminal of transistor 1121, and transistor 1613 being switched off to prevent the GT output (i.e., $GT_i$) from affecting the state of the match line 127. If the CAM cell 1603 is the most significant CAM cell in a chain of range CAM cells (including a chain of multi-mode CAM cells in range mode), then transistor 1613 may be omitted and the drain of transistor 1125 coupled directly to the match line 127 as shown by dashed line 1606. If the CAM cell 1603 is not the most significant CAM cell in a chain of range CAM cells, the $GT_i$ signal is output to a next more significant range CAM cell (or multi-mode CAM cell in range mode) as shown by dashed line 1608. Although the range compare function shown in FIG. 16 corresponds to an upper bound compare function (i.e., determining whether a comparand value exceeds and upper bound value), a lower bound compare function may be implemented without circuit change by applying a complemented version of the comparand value to the comparand lines (such that $\overline{C}$ is received at the gate terminals of transistors 608 and 1125 instead of C) and by storing a complemented version of the lower bound data within storage element 1605 (such that L is received at the gate of transistor 1127 instead of $\overline{U}$). Alternatively, a multiplexer responsive to a level select signal may be provided to select between complemented and uncomplemented versions of the comparand value (i.e., between C and $\overline{C}$) as in the embodiment of FIG. 14.

Still referring to FIG. 16, when the mode select signal 1102 is low, a binary mode of operation is selected, with transistor 1609 being switched off to prevent the incoming GT signal ($GT_{i-1}$) from being received at the source terminals of transistors 606 and 608, transistor 1611 being switched on to conduct the complemented comparand value $\overline{C}$ to the gate terminal of transistor 1121, and transistor 1613 being switched on to allow the output of the binary compare circuit formed by transistors 1121, 1123, 1125 and 1127 to pull the match line 127 low if the data value stored in the storage element 1605 does not match the incoming comparand value. Note that, in an alternative embodiment, transistor 1611 may be disposed in the path between the storage element 1605 and the gate of transistor 1123 instead of in the path between the comparand signal line and the gate of transistor 1121. Further, pass gates responsive to the mode select signal 1102 (i.e., such as transistor 1611) may be disposed in the paths to the gates of both transistors 1121 and 1123. Also, in an alternative embodiment, transistors 1611 and 1613 may be NMOS devices instead of the PMOS devices, with signal inverters coupled between the mode select input of the CAM cell 1603 and the gate terminals of the transistors 1613 and 1611.

System Structure and Operation

Figure 17:
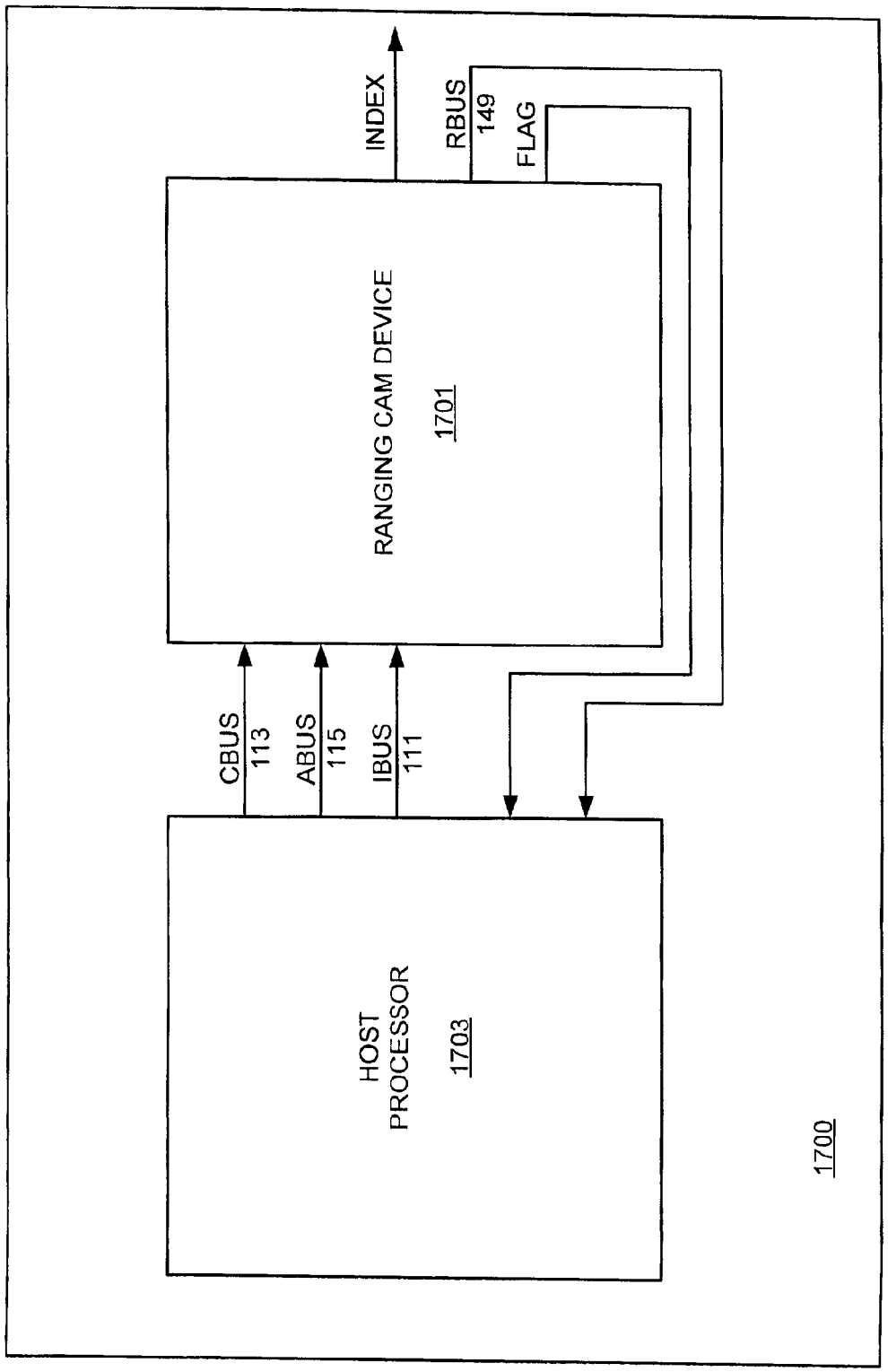
FIG. 17 illustrates a system that includes a host processor and a ranging CAM device.

FIG. 17 illustrates a system 1700 that includes a host processor 1703 (e.g., general purpose processor, digital signal processor, network processor, application-specific integrated circuit (ASIC), etc.) and a ranging CAM device 1701 according to one of the embodiments described herein. The system device may be, for example, a network switch or router, or any other type of device in which the compare capability of the CAM device 1701 may be useful.

The host processor 1703 issues addresses, comparands, and instructions to the ranging CAM device 1701 via the address, comparand and instruction buses, respectively (i.e., ABUS 113, CBUS 115 and IBUS 111), and receives status and other information from the ranging CAM device 1701 via a result bus 149 (RBUS). In the embodiment of FIG. 17, the flag signal (e.g., match flag, multiple match flag, full flag, etc.) is output directly to the host processor 1703, however, the flag signal (or flag signals) may alternatively or additionally be output to the host processor 1703 via the result bus 149. The CAM index (i.e., the index generated by the priority encoder 105 of FIG. 1) may be output to an associated storage and/or to the host processor 1703. Also, in alternative embodiments, one or more of the buses (e.g., ABUS, CBUS, IBUS, ADS) may be omitted and the corresponding information time multiplexed onto another of the buses. Further, the ranging CAM device 1701 and host processor 1703 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper thin package, etc.).

FIG. 18 illustrates the operation of the host processor 1703 of FIG. 17 according to one embodiment. At block

1801 the host processor receives an assignment rule that indicates an assignment of destination or classification information (e.g., destination address, destination port, class ID, etc.) to incoming packets having a particular value or range of values within one or more fields (e.g., fields within the packet prefix). At decision block 1803, the host processor determines whether the assignment rule specifies assignment of the destination or classification information to a range of packet values. If so, then a range definition may be used to express the assignment rule, and at decision block 1805 the processor determines whether a range field (i.e., chain of ranging CAM cells or multi-mode CAM cells) having a sufficient data storage width and CAM word offset is available within the ranging CAM device to store the range definition. If a chain of multi-mode CAM cells is available to store the range definition, then at block 1807, the host processor issues an instruction to the ranging CAM device identifying the chain of multi-mode cells and instructing the ranging CAM device to set the multi-mode CAM cells to operate in range mode. If the chain of multi-mode CAM cells is already in range mode (e.g., by default at system startup), or if the CAM cells are dedicated range CAM cells rather than multi-mode CAM cells, then block 1807 may be omitted. At block 1809, the host processor issues an write instruction to the CAM device to store an upper bound value in a given entry (entry$_i$) within the ranging CAM array of the ranging CAM device. The row address of the entry may be included in the write instruction, or the write instruction may reference an address value stored within the ranging CAM device, such as a register that stores an address of an available row of CAM cells within the ranging CAM device. At block 1811, the host processor issues a write instruction to the CAM device to store a lower bound value in entry$_i$ within the CAM device, thus effecting storage of an explicit range definition within the CAM device. Note that the write operations to store the upper and lower bound values are shown in parallel in blocks 1809 and 1811 to indicate that a single write command (or request or instruction) may be used to effect storage of the upper and lower bound values. Also, storage of either the upper bound value or the lower bound value may be omitted in the case of an implicit range definition.

At block 1813, the host processor issues a write instruction to the ranging CAM device to store data bits within binary or ternary CAM cells included within entry$_i$ of the CAM array. At block 1815, the host processor issues a write instruction to the ranging CAM device to store mask bits within ternary CAM cells included within entry$_i$ of the CAM array. Note that blocks 1813 and 1815 may be omitted in the event that the range definition (or definitions) constitutes the entire CAM word stored within entry$_i$. Also, if there are no mask bits to be stored in ternary CAM cells within entry$_i$, or there are no ternary CAM cells within the CAM array at entry$_i$ (e.g., binary CAM cells instead of ternary CAM cells), block 1815 may be omitted. In any event, a single write operation, or multiple write operations, may be used to write the upper bound, lower bound, data and/or mask values into the CAM array at entry$_i$. Returning to decision blocks 1803 and 1805, if no range assignment is needed or desirable to express the assignment rule received in block 1801, or if there is no available range field within the ranging CAM device, then at blocks 1817 and 1819, data bits and, if necessary, mask bits are stored within CAM array entry$_i$ (or multiple entries of the CAM array) to implement the assignment rule.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A content addressable memory (CAM) device comprising:
   a first plurality of storage circuits to store an upper value;
   a second plurality of storage circuits to store a lower value;
   a plurality of compare circuits to determine if a first comparand value is within a range of values defined by the upper value and the lower value, wherein the upper value comprises a plurality of bits ordered from a most significant bit to a least significant bit, and wherein each of the plurality of compare circuits is adapted to receive a respective one of the plurality of bits and to compare the one of the plurality of bits to a respective bit within the first comparand value; and
   a match line, wherein a most significant compare circuit of the plurality of compare circuits is coupled to the match line, the most significant compare circuit including circuitry to affect a logical state of the match line if either (1) a most significant bit of the first comparand value is greater than the most significant bit of the upper value, or (2) the most significant bit of the first comparand is equal to the most significant bit of the upper value, and a result signal from a less significant compare circuit of the plurality of compare circuits indicates that the first comparand value minus the value represented by the most significant bit of the first comparand value is greater than the upper value minus the value represented by the most significant bit of the upper value.

2. The CAM device of claim 1 wherein the first comparand value is a field of bits within a second comparand value.

3. The CAM device of claim 1 wherein each of the first plurality of storage circuits includes a memory element to store at least one bit of the upper value.

4. The CAM device of claim 1 wherein each of the plurality of compare circuits includes circuitry to compare a bit of the first comparand to a bit of the upper value and to output a result signal in a first state if the bit of the first comparand is greater than the bit of the upper value and to output the result signal in a second state if the bit of the first comparand is less than the bit of the upper value.

5. The CAM device of claim 4 wherein outputting the result signal in a first state comprises switchably coupling a match signal line to a predetermined voltage reference to affect a voltage level of the match signal line.

6. The CAM device of claim 5 wherein outputting the result signal in the second state comprises decoupling the match signal line from the predetermined voltage reference.

7. The CAM device of claim 5 wherein coupling the match signal line to a predetermined voltage reference comprises coupling the match signal line to a ground voltage reference to pull down the voltage level of the match signal line.

8. The CAM device of claim 4 further comprising a match line, and wherein a most significant compare circuit of the plurality of compare circuits is coupled to the match line, the most significant compare circuit being adapted to affect a logical state of the match line according to the result signal.

9. The CAM device of claim 8 wherein the most significant compare circuit is coupled to output the result signal to the match line.

10. The CAM device of claim 8 wherein at least one other of the plurality of compare circuits is coupled to output the result signal to the most significant compare circuit.

11. The CAM device of claim 1 wherein the lower value comprises a plurality of bits ordered from a most significant bit to a least significant bit, and wherein each of the plurality of compare circuits is adapted to receive a respective one of the plurality of bits and to compare the one of the plurality of bits to a respective bit within the first comparand value.

12. A content addressable memory (CAM) comprising:
   a first plurality of storage circuits to store an upper value;
   a second plurality of storage circuits to store a lower value; and
   a plurality of compare circuits to determine if a first comparand value is within a range of values defined by the upper value and the lower value, wherein the lower value comprises a plurality of bits ordered from a most significant bit to a least significant bit, and wherein each of the plurality of compare circuits is adapted to receive a respective one of the plurality of bits and to compare the one of the plurality of bits to a respective bit within the first comparand value; and
   a match line and wherein a most significant compare circuit of the plurality of compare circuits is coupled to the match line, the most significant compare circuit including circuitry to affect a logical state of the match line if either (1) a most significant bit of the first comparand value is less than the most significant bit of the lower value, or (2) the most significant bit of the first comparand is equal to the most significant bit of the lower value, and a result signal from a less significant compare circuit of the plurality of compare circuits indicates that the first comparand value minus the value represented by the most significant bit of the first comparand value is less than the lower value minus the value represented by the most significant bit of the lower value.

13. A content addressable memory (CAM) cell comprising:
   a first storage circuit to store a first boundary value;
   a first compare circuit to compare a comparand value to the first boundary value, the first compare circuit including circuitry to output a first result signal in a first state if the comparand value is greater than the first boundary value and in a second state if the comparand value is less than the first boundary value; and
   an input to receive a second result signal from another CAM cell, and wherein the circuitry to output the first result signal in the first state is adapted to output the first result signal in the first state if the comparand value is equal to the first boundary value and the second result signal is in the first state.

14. The CAM cell of claim 13 wherein the circuitry to output the first result signal is further adapted to output the first result signal in the second state if the comparand value is equal to the first boundary value and the second result signal is in the second state.

15. The CAM cell of claim 13 further comprising:
   a second storage circuit to store a second boundary value; and
   a second compare circuit to compare the comparand value to the second boundary value, the second compare circuit including circuitry to output a second result signal in the first state if the comparand is less than the second boundary value and in the second state if the comparand is greater than the second boundary value.

16. The CAM cell of claim 15 further comprising an input to receive a third result signal from a less significant CAM cell, and wherein the circuitry to output the second result signal in the first state is further adapted to output the second result signal in the first state if the comparand value is equal to the second boundary value and the third result signal is in the first state.

17. The CAM cell of claim 13 wherein the circuitry to output the first result signal is adapted to output the first result signal in the first state if the comparand is equal to the first boundary value.

18. The CAM cell of claim 13 wherein the circuitry to output the first result signal is adapted to output the first result signal in the second state if the comparand is equal to the first boundary value.

19. The CAM cell of claim 13 wherein the first boundary value is an upper boundary value.

20. A content addressable memory (CAM) device comprising:
   a first storage circuit to store a first value; and
   a compare circuit coupled to the first storage circuit to receive the first value and coupled to a mode signal line to receive a mode signal, the compare circuit being adapted to compare a comparand value to the first value and to output a first result signal, the first result signal indicating whether the comparand value is greater than the first value when the mode signal is in a first state, and the first result signal indicating whether or not the comparand is equal to the first value when the mode signal is in a second state.

21. The CAM device of claim 20 further comprising a second storage circuit to store a second value and coupled to provide the second value to the compare circuit, the compare circuit including circuitry to compare the comparand value to the second value and to output a second result signal, the second result signal indicating whether the comparand is less than the second value when the mode signal is in the first state.

22. The CAM device of claim 20 further comprising:
   a second storage circuit to store a second value and coupled to provide the second value to the compare circuit, the compare circuit including circuitry to compare the comparand value to the second value and, when the mode signal is in the first state, to output a second result signal indicating whether the comparand is less than the second value; and
   a mask circuit coupled to receive the second value from the storage circuit and coupled to the compare circuit, the mask circuit being adapted to selectively mask the first result signal, according to the second value, when the mode signal is in the second state.

23. The CAM device of claim 22 wherein the mask circuit is adapted to mask the first result signal by preventing the compare circuit from outputting the first result signal in a state indicative of inequality between the first value and the comparand.

24. The CAM device of claim 22 wherein the mask circuit is adapted to mask the first result signal by disabling the first value from being received in the compare circuit.

25. The CAM device of claim 22 wherein the mask circuit is adapted to mask the first result signal by disabling the comparand value from being received in the compare circuit.

26. A content addressable memory (CAM) device comprising:
   a first storage circuit to store a first value; and
   a first compare circuit coupled to receive the first value from the first storage circuit and having a select input to receive a level select signal, the first compare circuit being adapted to compare a comparand value to the first value and to assert a beyond-boundary signal if the level select signal is in a first state and if the comparand value is greater than the first value, the first compare circuit being further adapted to assert the beyond-boundary signal if the level select signal is in a second state and if the comparand value is less than the first value.

27. The CAM device of claim 26 further comprising:
a first input to receive a first signal representative of the comparand value;
a second input to receive a second signal representative of a complement of the comparand value; and
a select circuit coupled to the first input and the second input to select, according to a state of the level select signal, either the first signal or the second signal to be output to the compare circuit for comparison with the first value.

28. The CAM device of claim 27 wherein the select circuit is a multiplexer having a control input coupled to receive the level select signal and having first and second ports coupled respectively to the first and second inputs.

29. The CAM device of claim 26 wherein the first value is representative of an upper boundary value when the level select signal is in the first state, and wherein the first value is representative of a lower boundary value when the level select signal is in the second state.

30. The CAM device of claim 26 further comprising a mode select input to receive a mode select signal, the first compare circuit being enabled to assert the beyond-boundary signal if the mode select signal is in a first state and the first compare circuit being disabled from asserting the beyond-boundary signal if the mode select signal is in a second state.

31. The CAM device of claim 30 further comprising a second compare circuit to compare the comparand value and the first value and to assert a match signal indicative of whether the comparand value is equal to the first value, the second compare circuit being enabled to assert the match signal if the mode select signal is in the second state, and the second compare circuit being disabled from asserting the match signal if the mode select signal is in the first state.

32. A content addressable memory (CAM) device comprising:
a CAM array having a plurality of CAM cells; and
at least one mode select line coupled to at least one set of CAM cells within the plurality of CAM cells, the set of CAM cells being adapted to compare a comparand value to a range defined, at least in part, by a first value stored within the set of CAM cells if a mode select signal on the mode select line is in a first state, and the set of CAM cells being adapted to determine whether or not the comparand value is equal to the first value if the mode select signal is in a second state.

33. The CAM device of claim 32 further comprising a mode configuration circuit coupled to the mode select line, the mode configuration circuit including a storage circuit to store a mode value, the mode select signal being in either the first state or the second state according to the mode value.

34. The CAM device of claim 33 further comprising an interface to receive a first instruction from a host processor, the CAM device being adapted to store the mode value in the storage circuit in response to the first instruction.

35. The CAM device of claim 33 further comprising a mode select interface, and wherein the mode select line is coupled to the mode select interface to receive the mode select signal from an external device.

36. The CAM device of claim 35 wherein the external device is a host processor.

37. A system comprising:
a processor; and
a content addressable memory (CAM) device coupled to receive instructions and data values from the processor, the CAM device including a plurality of CAM cells and being responsive to a first instruction from the processor to select either a first operating mode or a second operating mode for the plurality of CAM cells, the plurality of CAM cells being adapted to compare a comparand value to a range defined, at least in part, by a first value stored within the plurality of CAM cells if the first operating mode is selected, and the plurality of CAM cells being adapted to determine whether or not the comparand value is equal to the first value if the second operating mode is selected.

38. The system of claim 37 wherein the CAM device includes a mode configuration circuit to store a mode select value in response to the first instruction, the mode select value indicating the first operating mode or the second operating mode according to the first instruction.

39. The system of claim 38 wherein the plurality of CAM cells is responsive to the mode select value to operate in either the first operating mode or the second operating mode.

40. The system of claim 38 wherein the CAM device includes additional CAM cells configured to operate only in the first operating mode.

41. The system of claim 38 wherein the CAM device includes additional CAM cells configured to operate only in the second operating mode.

42. A system comprising:
a processor; and
a content addressable memory (CAM) device coupled to receive instructions from the processor, the CAM device including a first plurality of CAM cells and being responsive to a first instruction from the processor to store a first boundary value in the first plurality of CAM cells, the first plurality of CAM cells being adapted to compare the first boundary value with a first comparand value in a compare operation and to output a first result signal indicative of whether the first comparand value is greater than the first boundary value, wherein the first plurality of CAM cells are responsive to a mode select signal to operate in either a range mode or a ternary mode, the first plurality of CAM cells being adapted to output the first result signal when operated in the range mode.

43. A system comprising:
a processor; and
a content addressable memory (CAM) device coupled to receive instructions from the processor, the CAM device including a first plurality of CAM cells and being responsive to a first instruction from the processor to store a first boundary value in the first plurality of CAM cells, the first plurality of CAM cells being adapted to compare the first boundary value with a first comparand value in a compare operation and to output a first result signal indicative of whether the first comparand value is greater than the first boundary value, wherein the first plurality of CAM cells are responsive to a mode select signal to operate in either a range mode or a binary mode, the first plurality of CAM cells being adapted to output the first result signal when operated in the range mode.

44. A system comprising:
a processor; and
a content addressable memory (CAM) device coupled to receive instructions from the processor, the CAM device including:
a first plurality of CAM cells to store a first boundary value in the first plurality of CAM cells in response to a first instruction from the processor, the first plurality of CAM cells being adapted to compare the first boundary value with a first comparand value in a compare operation and to output a first result signal indicative of whether the first comparand value is greater than the first boundary value; and
a second plurality of CAM cells to store a data value, the second plurality of CAM cells being adapted to compare the data value with a second comparand value in a compare operation and to output a first result signal indicative of whether the second comparand value is equal to the data value.

45. The system of claim 44 wherein the first plurality of CAM cells and the second plurality of CAM cells are each included within a first row of CAM cells within the CAM device.

46. The system of claim 44 wherein the first comparand value and the second comparand value each constitute a respective field of bits within a third comparand value.

47. The system of claim 42 wherein the CAM device is further responsive to the first instruction from the processor to store a second boundary value in the first plurality of CAM cells, and the first plurality of CAM cells being further adapted to compare the second boundary value with the second comparand in the compare operation and to output a second result signal indicative of whether the first comparand value is less than the second boundary value.

48. A system comprising:
a processor; and
a content addressable memory (CAM) device coupled to receive instructions from the processor, the CAM device including a first plurality of CAM cells and being responsive to a first instruction from the processor to store a first boundary value in the first plurality of CAM cells, the first plurality of CAM cells being adapted to compare the first boundary value with a first comparand value in a compare operation and to output a first result signal indicative of whether the first comparand value is greater than the first boundary value, wherein the CAM device includes multiple independently searchable storage blocks each having multiple rows of CAM cells therein, the first plurality of CAM cells being included within one of the rows of CAM cells in one of the searchable storage blocks.

49. The system of claim 48 wherein the CAM device further includes a block configuration circuit to store a block configuration value, and circuitry to configure at least one of the storage blocks to have a storage width and depth according to the block configuration value.

50. The system of claim 49 wherein the CAM device is responsive to a second instruction from the processor to store the block configuration value in the block configuration circuit.

51. The system of claim 49 wherein the block configuration circuit is adapted to store a mode value, and wherein the first plurality of CAM cells are responsive to the mode value to operate in either a range mode or a ternary mode, the first plurality of CAM cells being adapted to output the first result signal when operated in the range mode.

52. The system of claim 51 wherein the CAM device is responsive to a second instruction from the processor to store the mode value in the block configuration circuit.

53. The system of claim 49 wherein the block configuration circuit is adapted to store a mode value, and wherein the first plurality of CAM cells are responsive to the mode value to operate in either a range mode or a binary mode, the first plurality of CAM cells being adapted to output the first result signal when operated in the range mode.

54. A method of operation within a content addressable memory (CAM) device, the method comprising:
comparing a comparand value with a first value stored in a plurality of CAM cells within the CAM device;
asserting a first result signal if (1) the comparand value is within a range defined, at least in part, by the first value, and (2) a mode signal is in a first state; and
asserting the first result signal if (1) the comparand value matches the first value, and (2) the mode signal is in a second state.

55. The method of claim 54 further comprising storing the first value in the plurality of CAM cells in response to a write instruction.

56. The method of claim 54 wherein, when the mode signal is in the first state, comparing the comparand value with the first value comprises, in each CAM cell of the plurality of CAM cells, asserting a greater-than signal if either (1) a bit of the comparand value received within the CAM cell is greater than a bit of the first boundary value stored within the CAM cell, or (2) the bit of the comparand value is equal to the bit of the first boundary value and a greater-than signal is received from a less significant CAM cell within the plurality of CAM cells.

57. The method of claim 54 wherein, when the mode signal is in the first state, a greater-than signal asserted by a most significant one of the plurality of CAM cells constitutes the first result signal.

58. The method of claim 54 further comprising:
comparing a comparand value with a second value stored in the plurality of CAM cells; and
asserting a second result signal if the comparand value is less than the second value.

59. The method of claim 58 wherein comparing the comparand value with the second value comprises, in each CAM cell of the plurality of CAM cells, asserting a less-than signal if either (1) a bit of the comparand value received within the CAM cell is less than a bit of the second value stored within the CAM cell, or (2) the bit of the comparand value is equal to the bit of the second value and a less-than signal is received from a less significant CAM cell within the plurality of CAM cells.

60. The method of claim 59 wherein a less-than signal asserted by a most significant one of the plurality of CAM cells constitutes the second result signal.

61. A content addressable memory (CAM) device comprising:
means for comparing a comparand value with a first value stored in a plurality of CAM cells within the CAM device; and
means for asserting a first result signal if (1) the comparand value is within a range defined, at least in part, by the first value and (2) a mode signal is in a first state; and
means for asserting the first result signal if (1) the comparand matches the first value, and (2) the mode signal is in a second state.

62. The CAM device of claim 61 further comprising means for storing the first value in the plurality of CAM cells in response to a write instruction.

63. The CAM device of claim 61 wherein the means for comparing a comparand value with a first value comprises respective means within each CAM cell of the plurality of CAM cells for asserting a greater-than signal if either (1) a bit of the comparand value received within the CAM cell is greater than a bit of the first value stored within the CAM cell, or (2) the bit of the comparand value is equal to the bit of the first value and a greater-than signal is received from a less significant CAM cell within the plurality of CAM cells.

64. The CAM device of claim 61 further comprising:
means for comparing a comparand value with a second value stored in the plurality of CAM cells; and
means for asserting a second result signal if the comparand value is less than the second value.

65. The CAM device of claim 64 wherein the means for comparing a comparand value with a second value comprises respective means within each CAM cell of the plurality of CAM cells for asserting a less-than signal if either (1) a bit of the comparand value received within the CAM cell is less than a bit of the second value stored within the CAM cell, or (2) the bit of the comparand value is equal to the bit of the second value and a less-than signal is received from a less significant CAM cell within the plurality of CAM cells.

66. A CAM device comprising:
at least one range compare cell configured to store a bit of a range limit, wherein the at least one range compare cell is further configured to output a first result signal that indicates whether a first bit of a comparand is outside of a range defined by the bit of the range limit; and
at least one CAM cell configured to store a data bit, wherein the at least one CAM cell is further configured to output a match signal that indicates whether the stored data bit matches a second bit of the comparand, wherein at least one range compare cell and at least one CAM cell are coupled to a common match line.

67. The CAM device of claim 66 wherein the at least one CAM cell comprises a ternary CAM cell.

68. The CAM device of claim 66 wherein the at least one CAM cell comprises a binary CAM cell.

69. The CAM device of claim 66 wherein the at least one range compare cell comprises a configurable cell that selectively operates in one of a range compare cell mode and a ternary CAM cell mode.

70. The CAM device of claim 66 wherein the at least one range compare cell comprises a configurable cell that selectively operates in one of a range compare cell mode and a binary CAM cell mode.

71. The CAM device of claim 66 wherein the at least one range compare cell comprises:
at least one less significant range compare cell configured to output the result signal to a next more significant range compare cell, wherein the result signal is dependent on a result of a comparison of the stored range limit bit and the corresponding comparand bit, and a result signal output from a next less significant range compare cell; and
a most significant range compare cell configured to output a final result signal to the common match line, wherein the final result signal indicates at least whether the comparand is greater than or less than the stored range limit.

72. The CAM device of claim 66 wherein the result signal further indicates whether the stored range limit bit is equal to a corresponding comparand bit.

73. The CAM device of claim 71 wherein the final result signal output to the common match line further indicates whether the stored range limit is equal to the comparand.

74. A method for performing a range comparison operation in a content addressable memory (CAM) device to determine whether a comparand is within a range, the method comprising:
storing a first value in a plurality of range compare cells, including a most significant range compare cell, and a plurality of less significant range compare cells for storing bits of the first value according to their significance;
comparing bits of the comparand with corresponding bits of the first value;
outputting a result signal for each range compare cell based on the bit comparison, and on a result signal output by a next less significant range compare cell; and
outputting a final result signal from the most significant range compare cell to a match line, wherein the final result signal indicates at least whether the comparand is greater than or less than the first value, wherein the plurality of range compare cells comprises a plurality of configurable cells, including a most significant configurable cell, and a plurality of less significant configurable cells for storing bits of the first value according to their significance, the method further comprising, setting a mode select signal to select a range compare mode or a ternary CAM mode, wherein, in the ternary CAM mode, the first value comprises a data word and a mask word, and wherein, in the range compare mode, the first value comprises at least one of an upper range limit and a lower range limit.

75. The method of claim 74 wherein the final result signal indicates the comparand is within the range when, in the range compare mode, the comparand is less than the upper range limit.

76. The method of claim 74 wherein the final result signal indicates the comparand is within the range when, in the range compare mode, the comparand is greater than the lower range limit.

77. The method of claim 74 wherein final result signal indicates the comparand is within the range when, in the range compare mode, the comparand is less than the upper range limit or equal to the upper range limit.

78. The method of claim 74 wherein the final result signal indicates the comparand is within the range when, in the range compare mode, the comparand is greater than or equal to the lower range limit.

79. The method of claim 74 wherein the final result signal indicates the comparand is within the range when, in the range compare mode, the comparand is greater than the lower range limit and less than the upper range limit.

80. The method of claim 74 wherein the final result signal indicates the comparand is within the range when, in the range compare mode, the comparand is greater than or equal to the lower range limit and less than or equal to the upper range limit.

81. The method of claim 74, further comprising:
in the ternary CAM mode;
comparing a comparand bit with a masked data bit in each of the plurality of configurable cells; and
outputting a result signal based on the comparison from each configurable cell to the common match line; and
in the range compare mode;
comparing a comparand bit with an upper range bit in each of the plurality of configurable cells;

comparing a comparand bit with a lower range bit in each of the plurality of configurable cells;

outputting a first result signal from each less significant configurable cell to a next more significant configurable cell based on the lower range comparison and on a first result signal from a next less significant configurable cell;

outputting a second result signal from each less significant configurable cell to a next more significant configurable cell based on the upper range comparison and on a second result signal from the next less significant configurable cell;

outputting a first final result signal from the most significant configurable cell to the common match line based on based on the lower range comparison and on a first result signal from a next less significant configurable cell; and outputting a second final result signal from the most significant configurable cell to the common match line based on the upper range comparison and on a second result signal from the next less significant configurable cell.

* * * * *

UNITED STATES PATENT AND TRADEMARK OFFICE
CERTIFICATE OF CORRECTION

PATENT NO. : 7,035,968 B1
APPLICATION NO. : 09/963334
DATED : April 25, 2006
INVENTOR(S) : Jose P. Pereira Page 1 of 1

It is certified that error appears in the above-identified patent and that said Letters Patent is hereby corrected as shown below:

In the Claims:

Column 34, Line 3, change "based on based on" to -- based on --

Signed and Sealed this

Seventh Day of November, 2006

JON W. DUDAS
*Director of the United States Patent and Trademark Office*